US012784840B2

(12) United States Patent
Shenoy et al.

(10) Patent No.: US 12,784,840 B2
(45) Date of Patent: Nov. 3, 2026

(54) READ IN MULTI-TIER NON-VOLATILE MEMORY

(71) Applicant: Sandisk Technologies, Inc., Milpitas, CA (US)

(72) Inventors: Manoj Shenoy, Kochi (IN); Gopu S, Kollam (IN); Binoy Jose Panakkal, Kochi (IN)

(73) Assignee: Sandisk Technologies, Inc., Milpitas, CA (US)

( * ) Notice: Subject to any disclaimer, the term of this patent is extended or adjusted under 35 U.S.C. 154(b) by 434 days.

(21) Appl. No.: 18/483,010

(22) Filed: Oct. 9, 2023

(65) Prior Publication Data

US 2025/0118376 A1 Apr. 10, 2025

(51) Int. Cl.

| | |
|---|---|
| ***G11C 16/28*** | (2006.01) |
| ***G11C 16/08*** | (2006.01) |
| ***G11C 16/10*** | (2006.01) |
| ***G11C 16/34*** | (2006.01) |

(52) U.S. Cl.

CPC .............. *G11C 16/28* (2013.01); *G11C 16/08* (2013.01); *G11C 16/102* (2013.01); *G11C 16/3445* (2013.01)

(58) Field of Classification Search

CPC ....... G11C 16/28; G11C 16/08; G11C 16/102; G11C 16/3445

USPC .................................................. 365/189.011

See application file for complete search history.

(56) References Cited

U.S. PATENT DOCUMENTS

| | | | | |
|---|---|---|---|---|
| 9,236,133 | B2 | 1/2016 | Yanamanamanda et al. | |
| 9,564,233 | B1 | 2/2017 | Cho et al. | |
| 9,697,905 | B2 | 7/2017 | Sharon et al. | |
| 10,095,417 | B1 | 10/2018 | Jeon et al. | |
| 10,157,680 | B2 | 12/2018 | Yang et al. | |
| 10,726,920 | B2 | 7/2020 | Yang | |
| 11,189,337 | B1 | 11/2021 | Lien et al. | |
| 11,430,531 | B2 | 8/2022 | Bazarsky et al. | |
| 11,488,684 | B1 | 11/2022 | Sharon et al. | |
| 2013/0051148 | A1 | 2/2013 | Lee et al. | |
| 2022/0293187 | A1 | 9/2022 | Guo et al. | |
| 2023/0317169 | A1* | 10/2023 | Zhu | G11C 16/08 365/185.17 |

FOREIGN PATENT DOCUMENTS

| | | | | |
|---|---|---|---|---|
| CN | 115985372 A * | 4/2023 | | G11C 16/32 |
| KR | 102856853 B1 * | 9/2025 | | G11C 16/3404 |

* cited by examiner

*Primary Examiner* — Joshua L Schwartz
(74) *Attorney, Agent, or Firm* — Pearl Cohen LLP

(57) ABSTRACT

Technology for reading memory cells in three-dimensional memory having multiple tiers. The memory system erases the tiers within each block independently. Then, memory cells in the tiers are programmed by units such as word lines. The memory system determines one or more read parameters for the selected tier based on the programmed/erased states of the other tiers in the block. For example, the memory system may select read reference levels for the selected tier based on the programmed/erased states of the other tiers. In an aspect, the one or more read parameters are used to determine the set of reference voltages for a bit error rate estimation scan (BES).

19 Claims, 21 Drawing Sheets

Figure 8

800

| Tier 2 | Tier 1 | Tier 0 |
|---|---|---|
| Erased | Erased | Read (Programmed) |
| Erased | Programmed | Read (Programmed) |
| Programmed | Erased | Read (Programmed) |
| Programmed | Programmed | Read (Programmed) |
| Erased | Read (Programmed) | Erased |
| Erased | Read (Programmed) | Programmed |
| Programmed | Read (Programmed) | Erased |
| Programmed | Read (Programmed) | Programmed |
| Read (Programmed) | Erased | Erased |
| Read (Programmed) | Erased | Programmed |
| Read (Programmed) | Programmed | Erased |
| Read (Programmed) | Programmed | Programmed |

Figure 9

900

| Selected Tier | Other (un-selected) Tiers | | Read Offset |
|---|---|---|---|
| Read Tier 0 | Tier 1 | Tier 2 | |
| | Programmed | Programmed | 0xF1 |
| | Erased | Programmed | 0xF2 |
| | Programmed | Erased | 0xF3 |
| | Erased | Erased | 0xF4 |
| | | | |
| Read Tier 1 | Tier 0 | Tier 2 | |
| | Programmed | Programmed | 0xF1 |
| | Erased | Programmed | 0xF5 |
| | Programmed | Erased | 0xF3 |
| | Erased | Erased | 0xF4 |
| | | | |
| Read Tier 2 | Tier 0 | Tier 2 | |
| | Programmed | Programmed | 0xF1 |
| | Erased | Programmed | 0xF5 |
| | Programmed | Erased | 0xF2 |
| | Erased | Erased | 0xF4 |

READ IN MULTI-TIER NON-VOLATILE MEMORY

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block. The blocks may be divided into smaller units. Herein, the term "tier" will be used to refer to a portion of a block that has been divided such that different sets of word lines are in different tiers. Therefore, each tier contains only a subset of the memory cells of each NAND string in the block. A block may be divided into two, three, or more tiers. A "tier" of a block may also be referred to herein as a sub-block.

For memory such as NAND, a large set of memory cells are erased prior to programming. Herein, a set of memory cells that are erased as a unit are referred to as an "erase group". In some techniques an erase group coincides with a block. In some cases an erase group is a portion of a block such as one tier. Thus, in some techniques each tier may be erased independent of the other tiers in the block.

After erasing, the memory cells within the erase group are programmed one unit at a time. In some techniques, the memory cells are programmed one word line at a time. The non-volatile memory cells may be programmed to store data. Typically, the memory cells are programmed to a number of data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell. 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

Once the memory cells in the memory device have been programmed, data may be read from the memory cells by sensing the programmed states of the memory cells. In one technique, the memory cells are sensed at one or more "read reference voltages" A read reference voltage is used to distinguish between two of the states. However, sensed states can sometimes vary from the written states due to one or more factors. Error detection and correction decoding can be used to detect and correct data errors resulting from sensed states that do not match written states. However, there is a limit as to how many bits in the un-decoded data read from the memory cells can be in error in order for the ECC algorithm to successfully correct all errors. Therefore, memory systems typically do not rely only on ECC algorithms. Another option is to move the read reference voltages and re-read the memory cells. In some cases, moving the read reference voltages can result in fewer bits in errors in the data prior to decoding to thereby improve the effectiveness ECC algorithm. One possible technique is to execute an ECC algorithm on data read with different candidate read reference voltages and then select the best read reference voltages based on an evaluation of the decoding process.

However, challenges remain in determining suitable read parameters for reading a group of memory cells such that there will be a low number of bits in error in the un-decoded data. For example, although read reference voltages can be moved with the read being re-tried this will consume additional time, current, and/power. Moreover, moving the read reference voltages and evaluating the decoding results may take many attempts to locate the best read reference voltages.

BRIEF DESCRIPTION OF THE DRAWINGS

Like-numbered elements refer to common components in the different figures.

FIG. 8 depicts a table of programmed/erased states for either tiers when a tier is being read.

FIG. 9 depicts a read parameter table containing example offsets to read reference levels for a three tier example.

DETAILED DESCRIPTION

Technology is disclosed herein for reading memory cells in three-dimensional memory having multiple tiers. The memory system erases the tiers within each block independently. Then, memory cells in the tiers are programmed by units such as word lines. However, it is possible that when reading a selected tier that the other tiers in the block ("non-selected tiers") are either programmed or erased. The programmed/erased states of the other tiers can impact the reading of the memory cells in the selected tiers. For example, the programmed/erased states of the other tiers may impact the Vt of memory cells in the selected tier. In an embodiment, the memory system will determine one or more read parameters for the selected tier based on the programmed/erased states of the other tiers in the block. In one embodiment, the memory system will select read reference levels for the selected tier based on the programmed/erased states of the other tiers. In an embodiment, the one or more read parameters are used to determine the set of reference voltages for a bit error rate estimation scan (BES). Briefly, the BES may include sensing memory cells using the aforementioned set of reference voltages, and then determining an error metric for codewords derived from the sensing. The error metric may be, for example, a syndrome weight (SW) or a bit error rate (BER). Accurate reference voltages should have a low SW (or low BER). Thus, the final reference voltages for use in the selected tier may be those having a low SW (or low BER). Therefore, the reference voltages may be dynamically updated such that the selected tier can be read accurately and quickly. Time, power and/current are not wasted re-trying the read with many different read levels. Note that the savings are not limited to reading the cells, but also executing an ECC algorithm on the data re-read from the memory cells.

In an embodiment, each block has an upper tier, a middle tier, and a lower tier, with each tier containing a different section of each NAND string in the block. The lower tier and the middle tier may be separated by a first interface layer having a first set of fabrication joints. The middle tier and the upper tier may be separated by a second interface layer having a second set of fabrication joints. In an embodiment, the NAND strings are formed in memory holes, with each fabrication joint providing an electrical connection between a NAND channel in one tier with a NAND channel in another tier. Therefore, the NAND strings may extend from the lower tier to the upper tier. In an embodiment, the programmed/erased states of the non-selected tiers are used to determine one or more read parameters for the tier selected for read.

Figure 1:
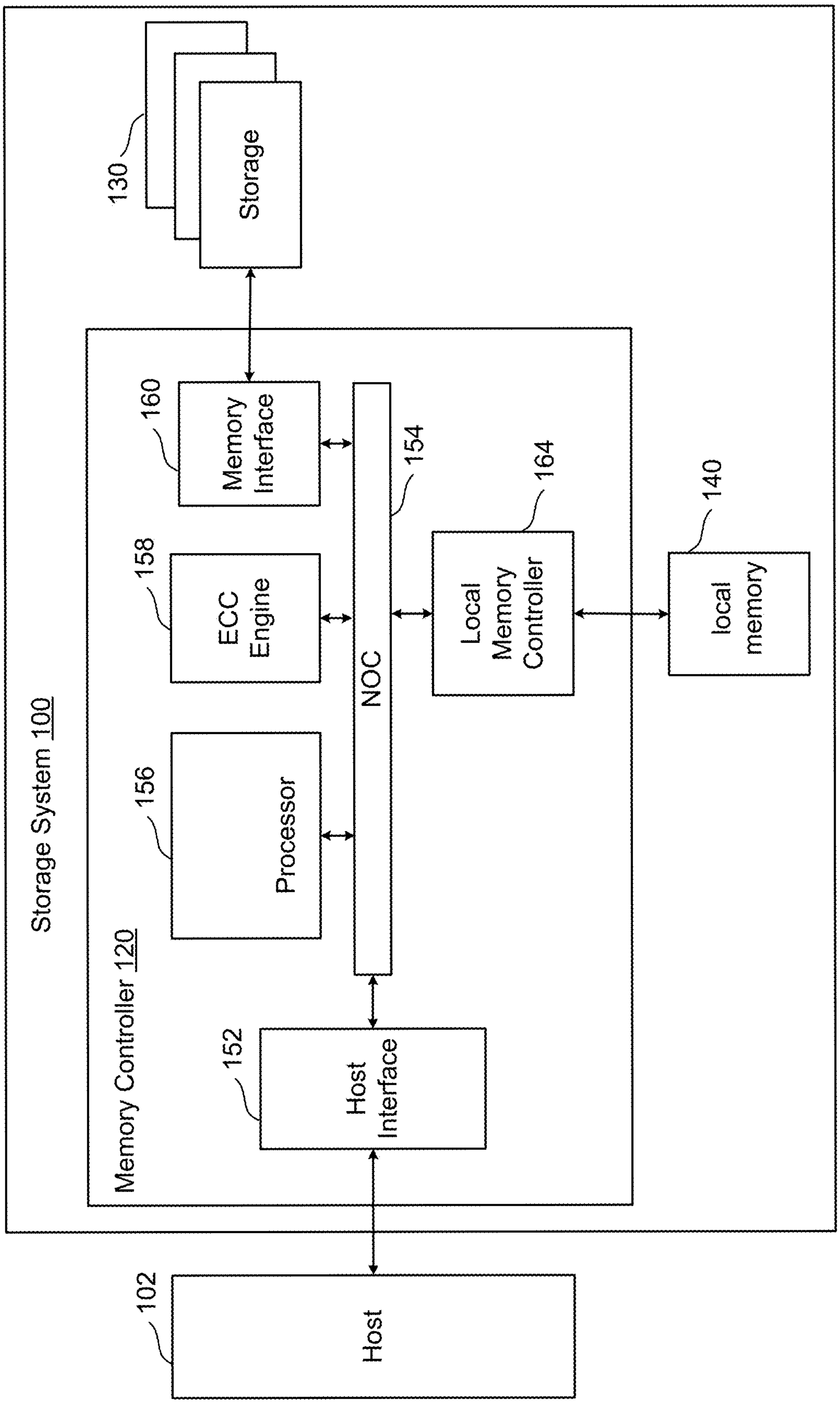
FIG. 1 is a block diagram depicting one embodiment of a storage system.

FIG. 1 is a block diagram of one embodiment of a storage system 100 that implements the technology described herein. An embodiment of the storage system 100 reads in a multi-tier memory with one or more read parameters based on programmed/erased states of non-selected tiers. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device, appliance, or another apparatus that uses memory and has data processing capabilities. In some embodiments, host 102 is separate from, but connected to, storage system 1N). In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the N(XC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments. N(C 154 can be replaced by a bus. Connected to and in communication with NOC 154 is processor 156. ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
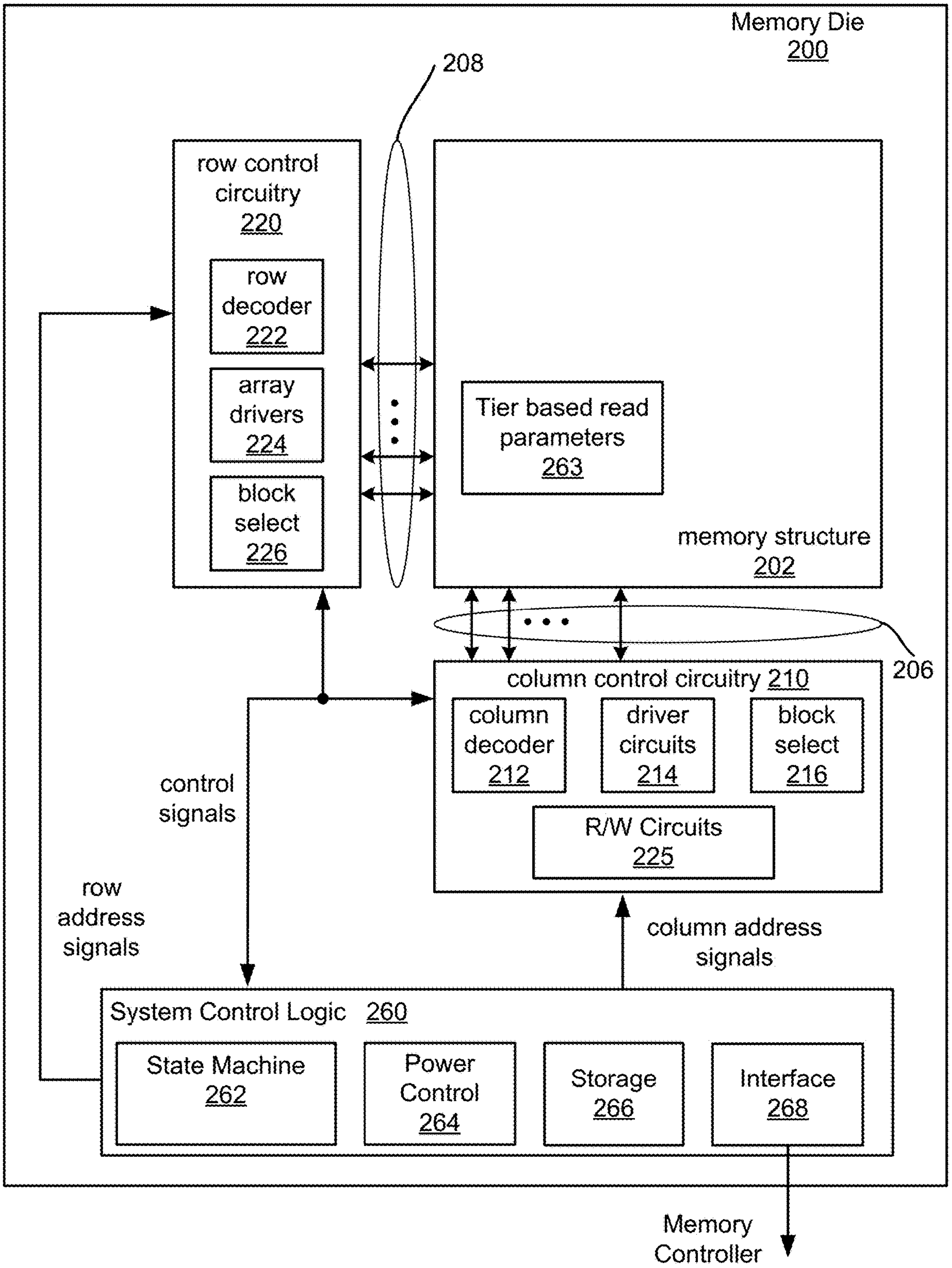
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select 216, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

In an embodiment, the memory die 200 stores tier based read parameters 263. FIG. 2A shows that the parameters 263 may be stored in the memory structure 202. The parameters 263 may be loaded into the storage 266 when the die is powered on. In one embodiment, the tier based read parameters 263 contains a table of read reference voltages. The table may specify read reference voltages for a tier based on the programmed/erased states of other tiers in the same block. In one embodiment, the state machine 262 (or other circuitry) selects what read reference voltages to use when reading a tier based on the programmed/erased states of the other tiers in the block.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM. Spin Transfer Torque MRAM, Spin Orbit Torque MRAM). FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses Note that the use of"pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 10 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Figure 4:
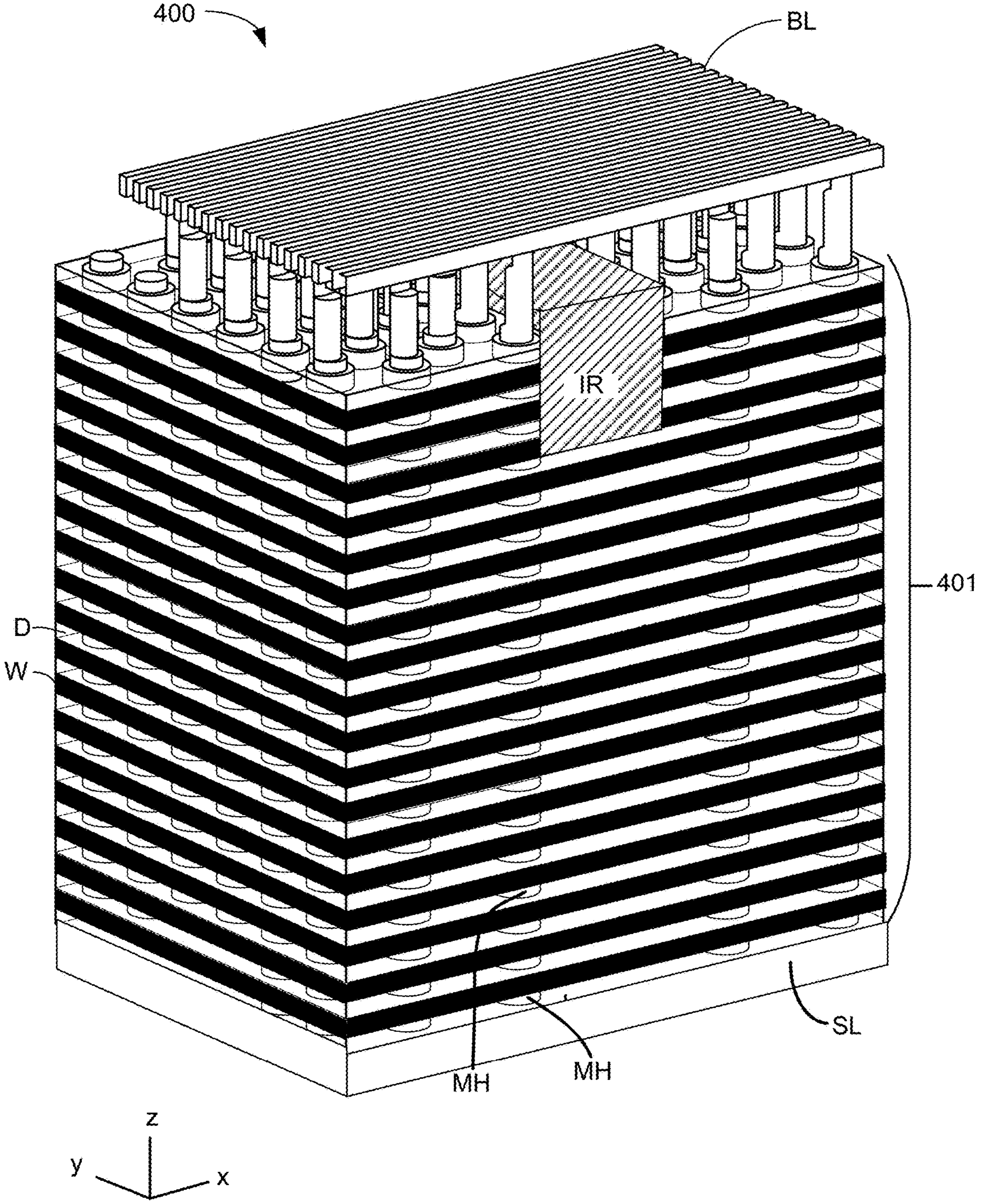
FIG. 4 is a perspective view of a portion of one example embodiment of a monolithic three dimensional memory structure.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example. FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory. ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
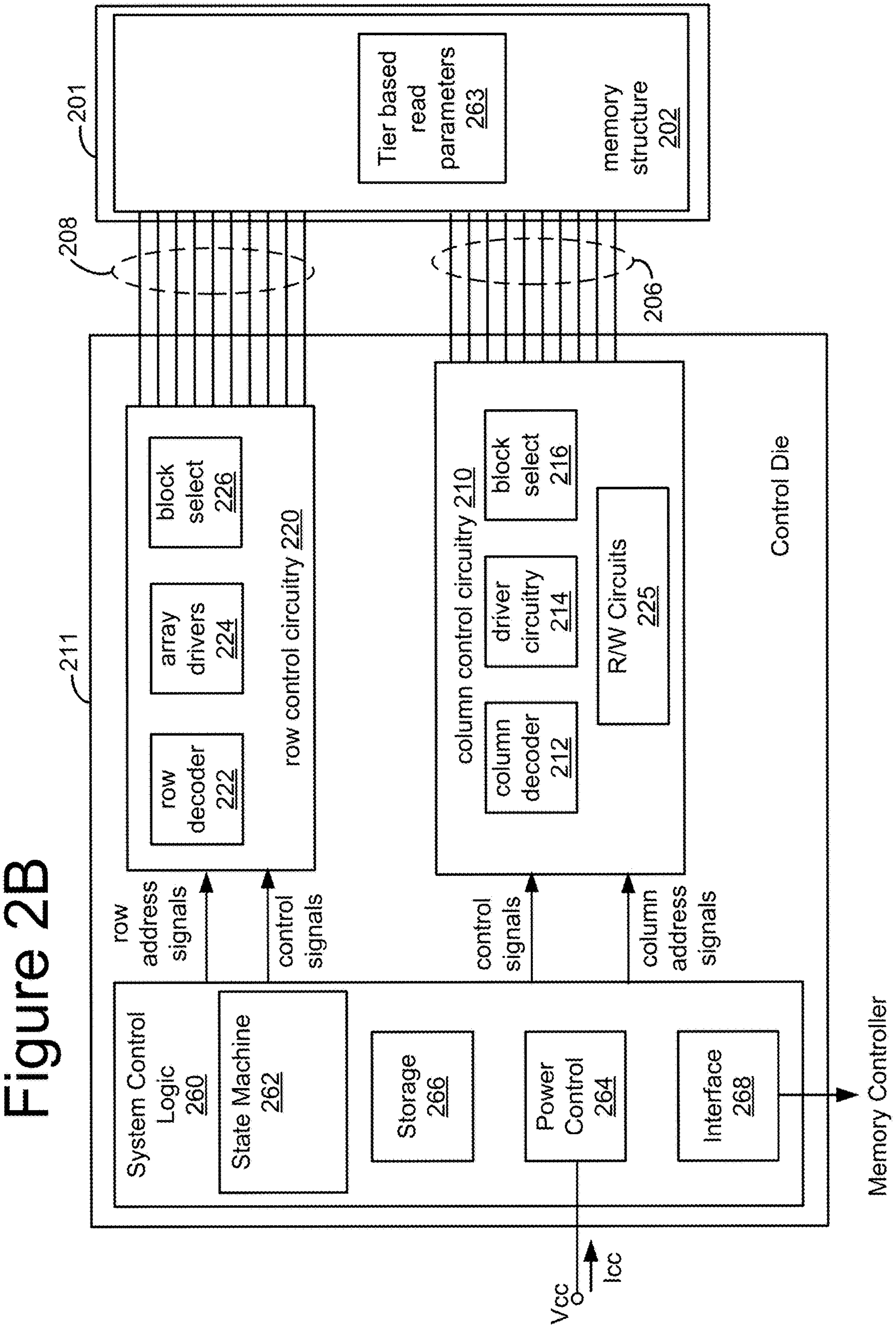
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor. FPGA. ASIC, integrated circuit, or other type of circuit.

For purposes of this document, the term "apparatus" can include, but is not limited to, one or more of, storage system 100, storage 130, memory die 200, integrated memory assembly 207, and/or control die 211.

Figure 3A:
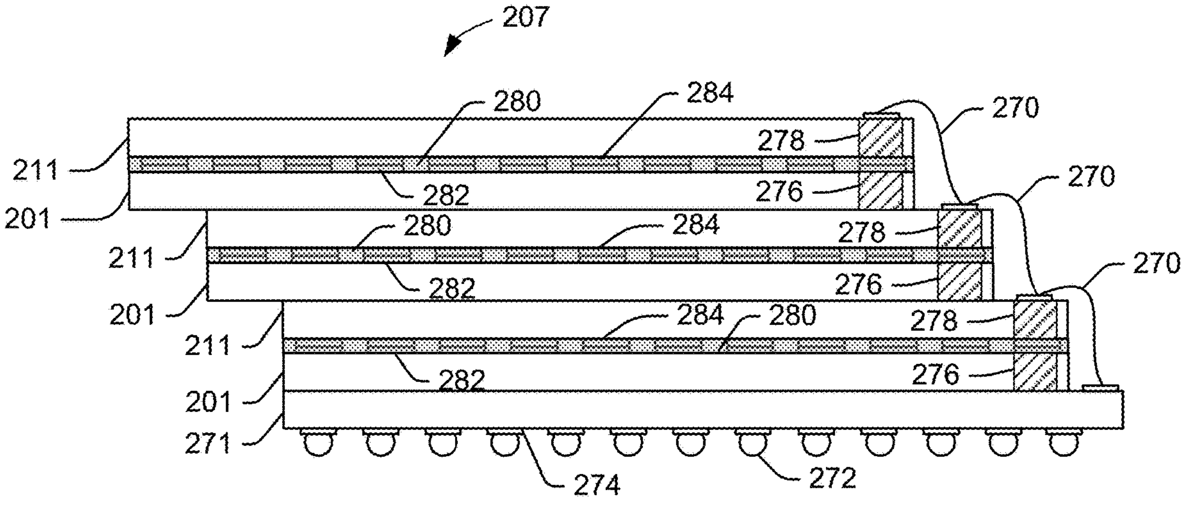
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
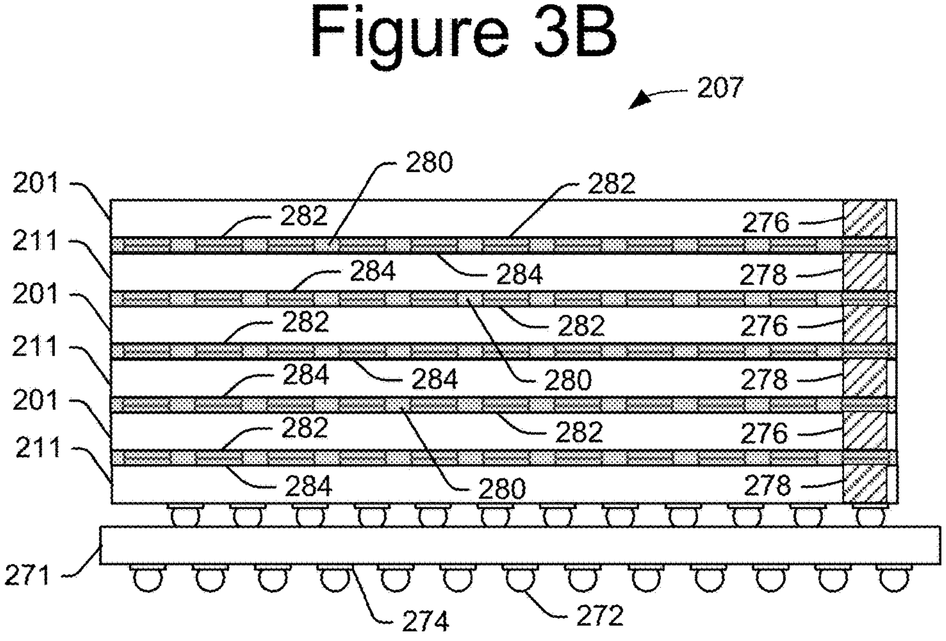

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
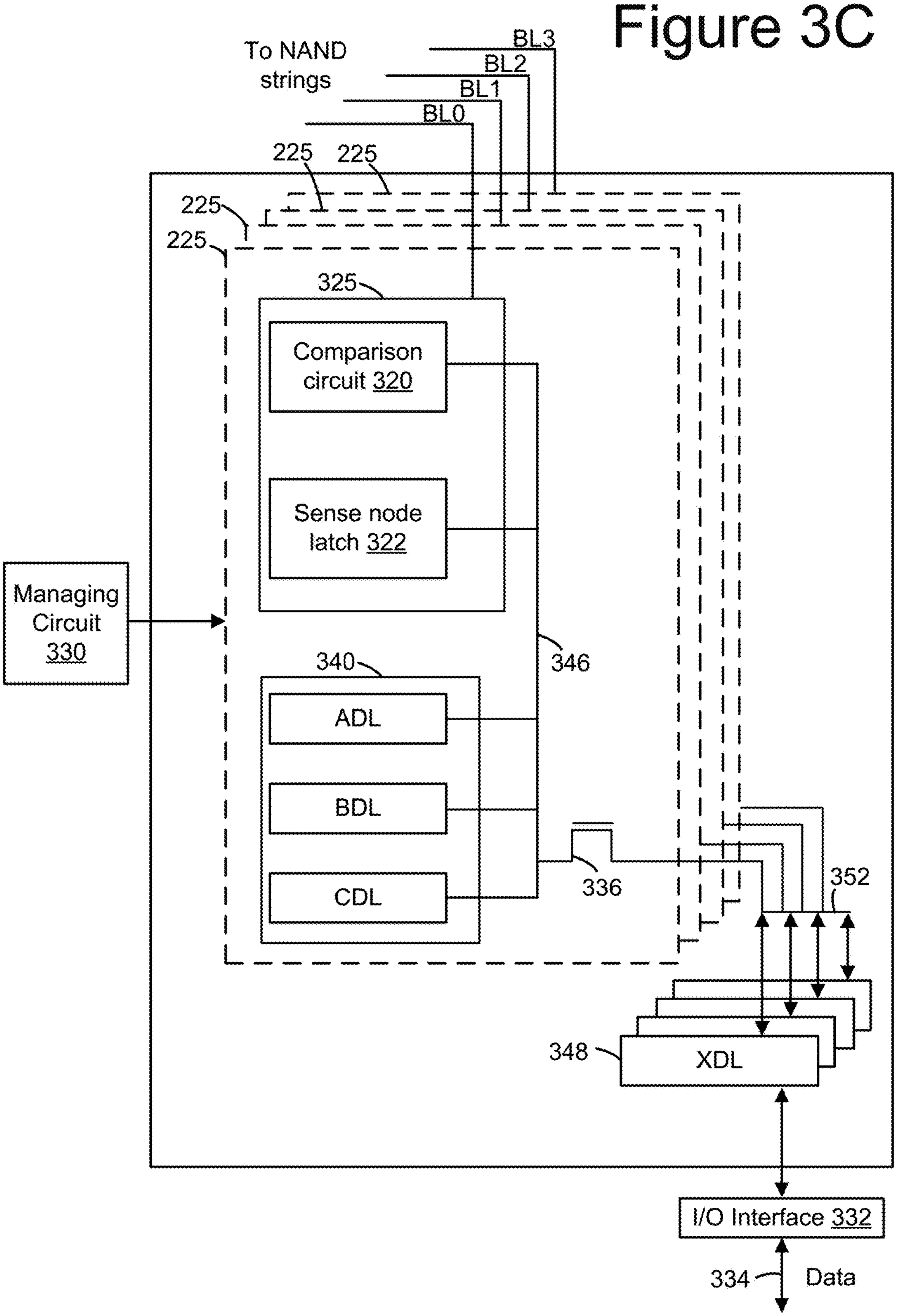
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current. Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of regions (e.g., fingers or strings) by isolation regions IR. FIG. 4 shows one isolation region IR separating two fingers. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
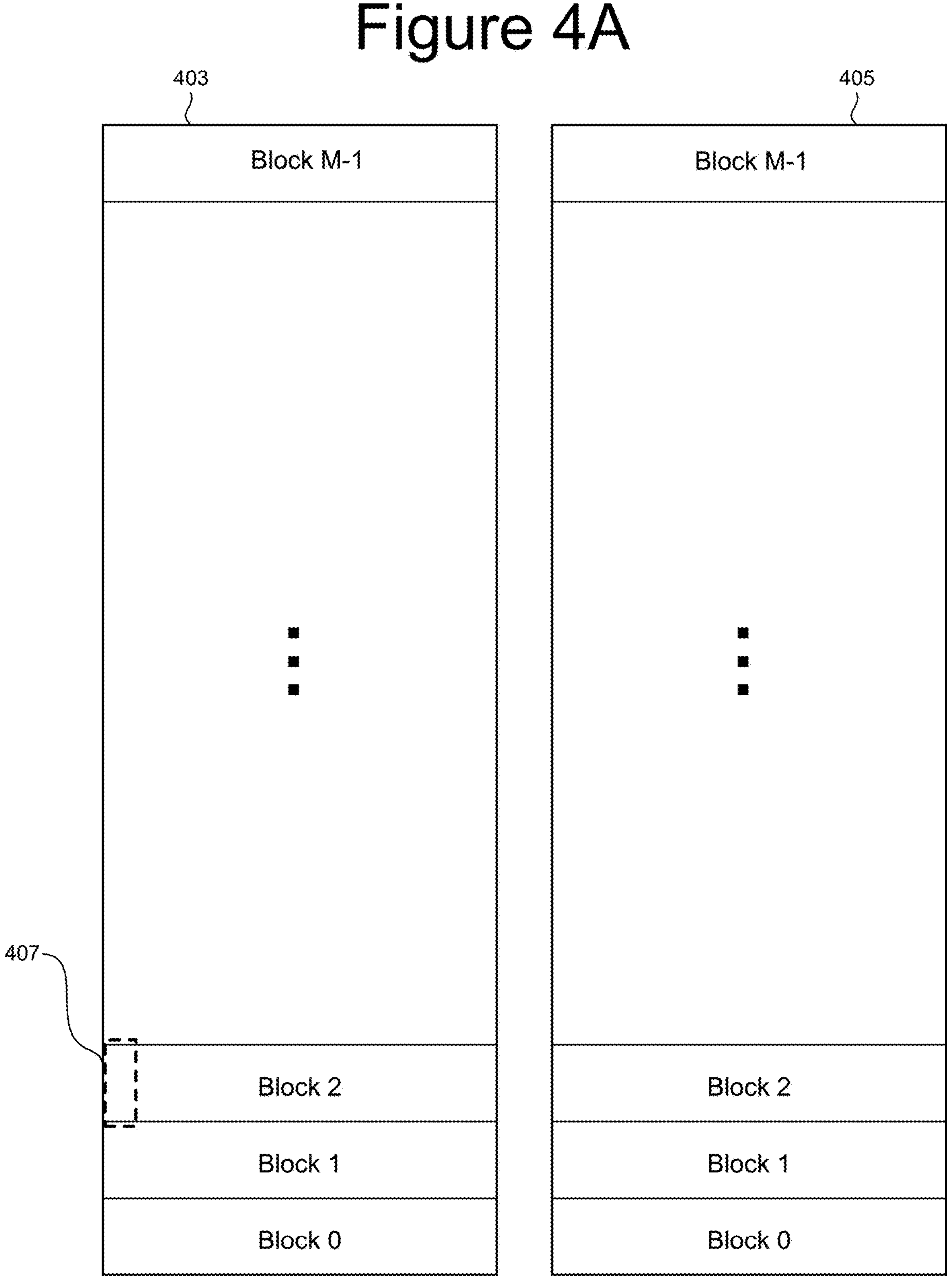
FIG. 4A is a block diagram of one embodiment of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment of a full-block mode, a block of memory cells is a unit of erase. That is, all memory cells of a block are erased together. In one embodiment of a sub-block mode, blocks can be divided into sub-blocks and the sub-blocks are the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
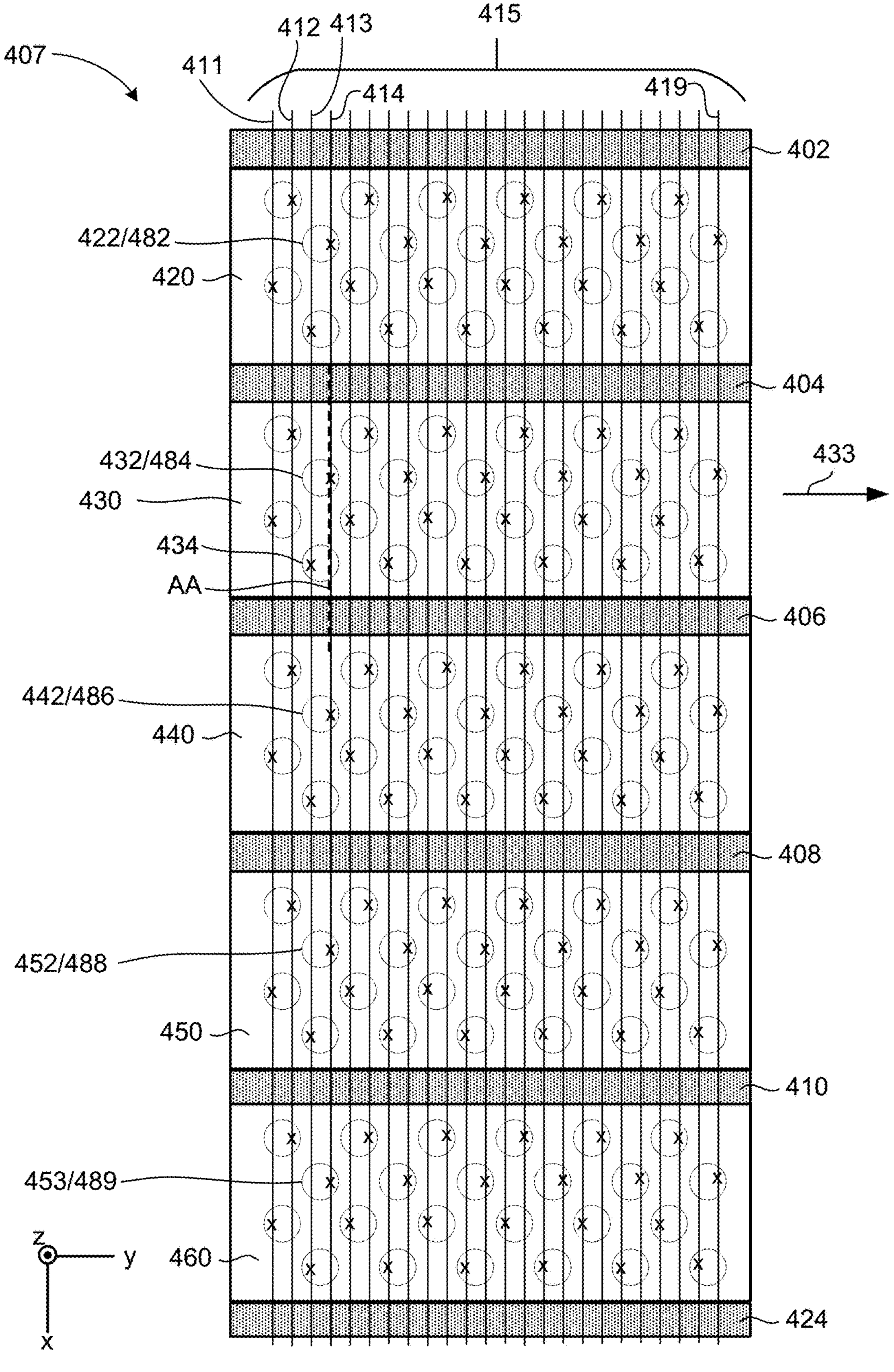
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however. FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the physical block from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, 408, or 410. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
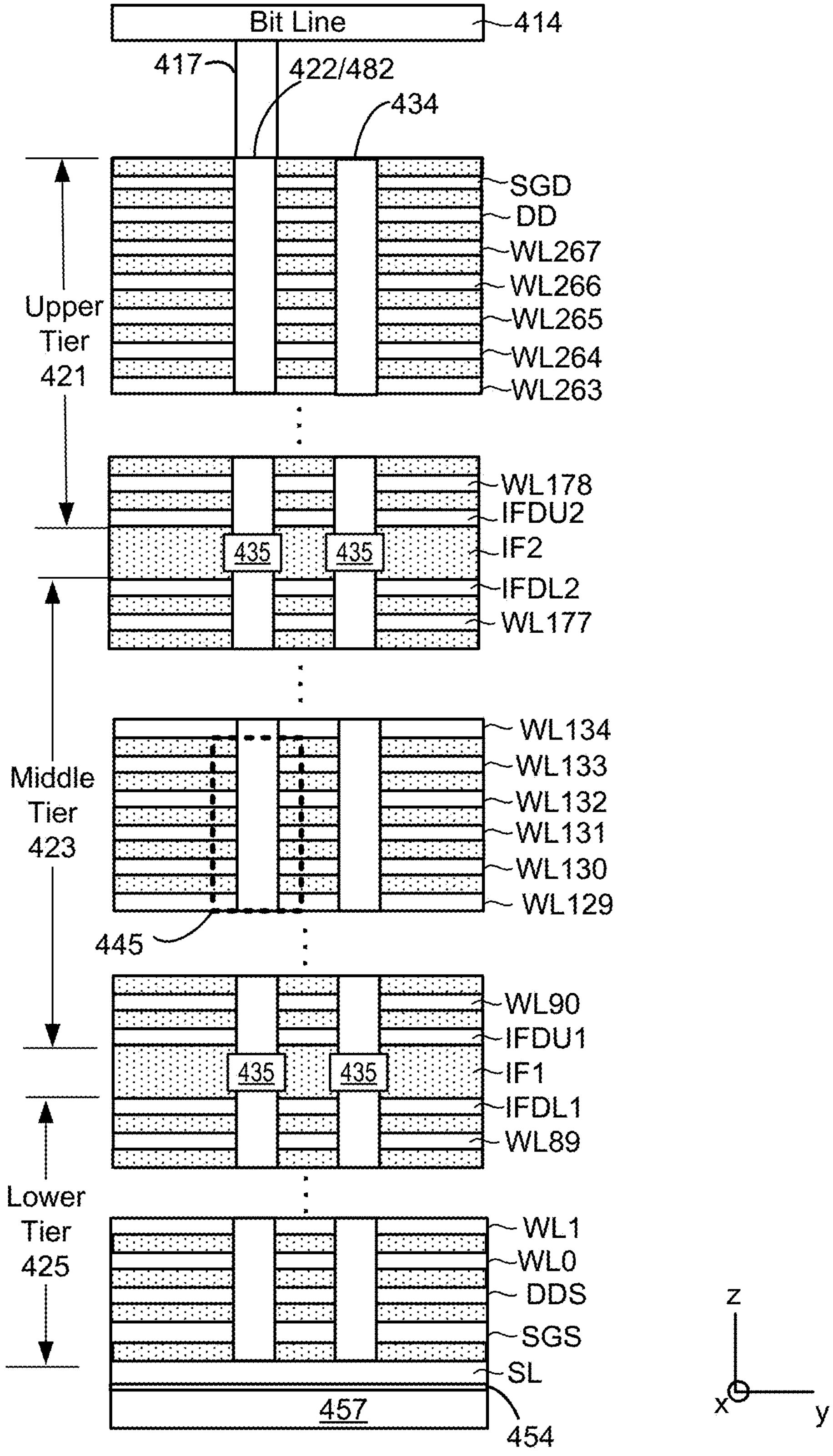
FIG. 4C depicts an embodiment of a stack showing a cross-sectional view along line AA of FIG. 4B.
Figure 4D:
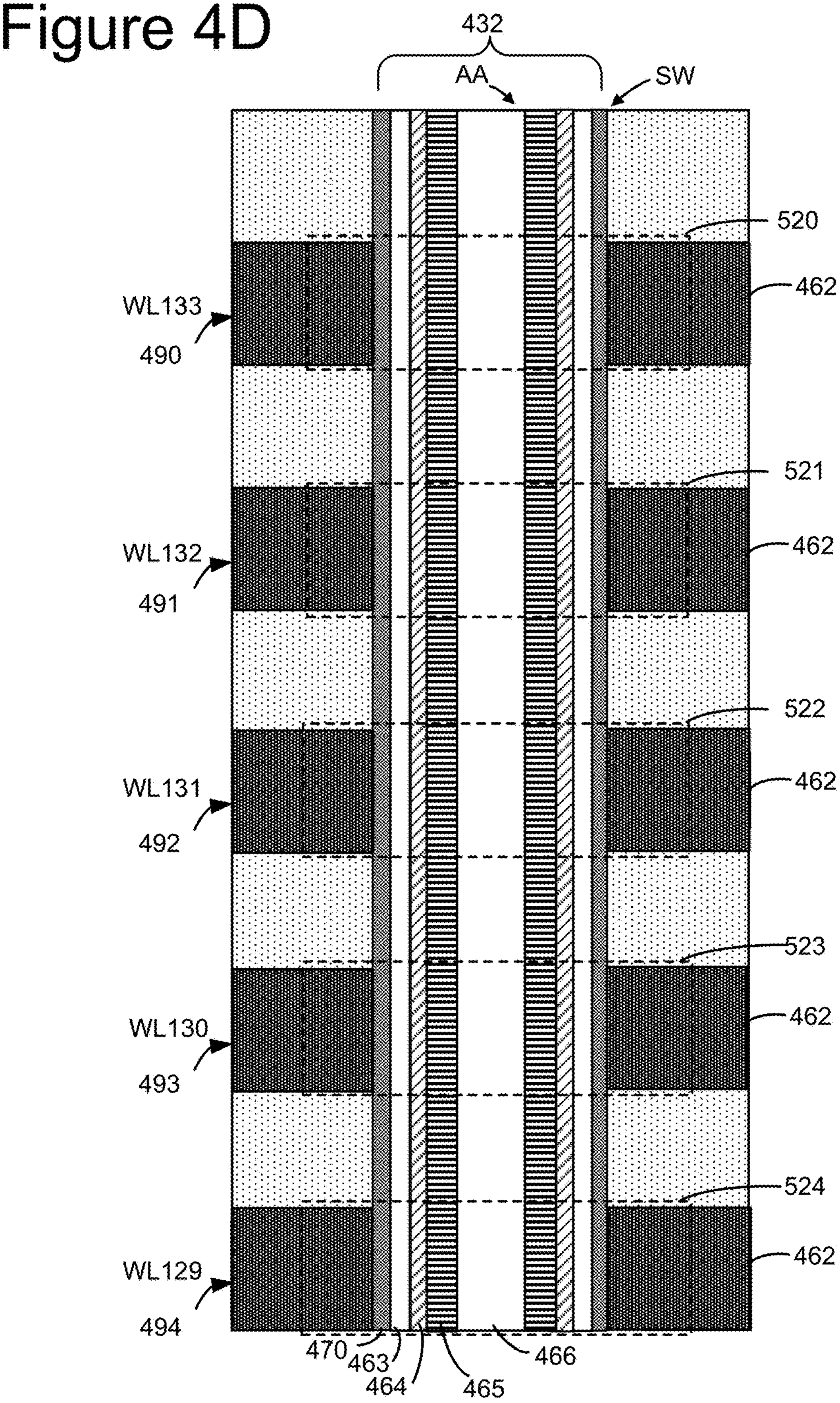
FIG. 4D depicts a view of the region 445 of FIG. 4C.

FIG. 4C depicts a portion of one embodiment of a three dimensional memory structure 202 showing a cross-sectional view along line AA of FIG. 4B. This cross sectional view cuts through vertical columns (NAND strings) 432 and 434 of region 430 (see FIG. 4B). FIG. 4D depicts an embodiment of a stack having three tiers. The three-tier stack comprises an upper tier 421, middle tier 423, and a lower tier 425. Each tier contains the memory cells of only a portion of each NAND string. Thus, each tier has a different portion (e.g., upper, middle, lower) of each NAND string in the block. The memory holes in the lower tier 425 and the middle tier 423 may be joined by fabrication joints 435. Likewise, the memory holes in the upper tier 421 and the middle tier 423 may be joined by fabrication joint 435. A fabrication joint is configured to provide an electrical connection between the channel of a section of NAND string in one tier with the channel of a section of NAND string in an adjacent tier. A fabrication joint may contain a conductive region such as doped silicon or Tungsten in order to provide this electrical connection. The fabrication joints 435 reside in an interface layer IF1 or IF2. The interface layers IF1, IF2 may contain an insulator such as silicon oxide in addition to the fabrication joints 435. In some embodiments, a fabrication joint 435 contains a junction transistor that is able to provide the electrical connection between the channel of a section of NAND string in one tier with the channel of a section of NAND string in an adjacent tier. In this case, each respective interface layer (IF1, IF2) may contain a conductive layer to drive the gates of the junction transistors.

A three-tier other multi-tier stack can be used to form a relatively tall stack while maintaining a relatively narrow memory hole width (or diameter). After the layers of the lower tier 425 are formed, memory hole portions are formed in the lower tier 425. After the layers of the middle tier are formed, memory hole portions are formed in the middle tier. After the layers of the upper tier are formed, memory hole portions are formed in the upper tier. The memory holes of the upper tier are aligned with the memory holes of the middle tier and the upper tier and middle tier are joined together. In an embodiment a fabrication joint 435 connects a memory hole of the upper tier with a memory hole in the middle tier. The memory holes of the lower tier are aligned with the memory holes of the middle tier and the lower tier and middle tier are joined together. In an embodiment a fabrication joint 435 connects a memory hole of the middle tier with a memory hole in the lower tier. Therefore, the respective fabrication joints 435 may provide a conductive connection between the NAND channels in one tier with the NAND channels in another tier. Thus, the NAND strings will extend continuously through the three tiers. Hence. NAND strings may extend from one end of the stack to the other.

The resulting memory hole is narrower than would be the case if the memory hole was etched from the top to the bottom of the stack rather than in each tier individually. The interface layers (IF1, IF2) are created where each pair of tiers are connected. Due to the presence of the interface layers, the adjacent word line layers may suffer from edge effects such as difficulty in programming or erasing. These adjacent word line layers can therefore be set as dummy word lines (IFDL1, IFDU1, IFDL2, IFDU2). In an embodiment, the memory system operates the dummy word lines (IFDL1, IFDU1, IFDL2, IFDU2) as dummy word lines in both the full-block mode and the sub-block mode.

The structure of FIG. 4C also includes a drain side select gate layer (SGD) and a source side select gate layer (SGS). There may be multiple SGD layers as well as multiple SGS layers. The structure of FIG. 4C also includes dummy word line layers DD, DDS: two hundred sixty eight data word line layers WL0-WL267 for connecting to data memory cells. Dielectric layers are depicted between the conductive layers just described. Other embodiments can implement more or fewer than the numbers described above for FIG. 4C.

In the sub-block mode, the upper tier 421, middle tier 423, and the lower tier 425 may be erased independently of each other. Hence, data may be maintained in the other tiers 421, 423 after the lower tier 425 is erased. Likewise, data may be maintained in the other tiers 421, 425 after the middle tier 423 is erased. Likewise, data may be maintained in the other tiers 423, 425 after the upper tier 421 is erased.

Vertical columns 432 and 434 are depicted protruding through the drain side select layer, source side select layer, IF layers, dummy word line layers, reconfigurable word line layers and data word line layers. In one embodiment, each vertical column comprises a vertical NAND string. Below the vertical columns and the layers listed below is substrate 457, an insulating film 454 on the substrate, and source line SL. The NAND string of vertical column 432 has a source end at a bottom of the stack and a drain end at a top of the stack. As in agreement with FIG. 4B. FIG. 4C shows vertical column 432 connected to bit line 414 via connector 417.

For ease of reference, drain side select layer, source side select layer, dummy word line layers, data word line layers, and reconfigurable word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W267 connect to memory cells (also called data memory cells). Dummy word line layers DD and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS are used to electrically connect and disconnect (or cut off) the channels of respective NAND strings from the source line SL.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer. e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
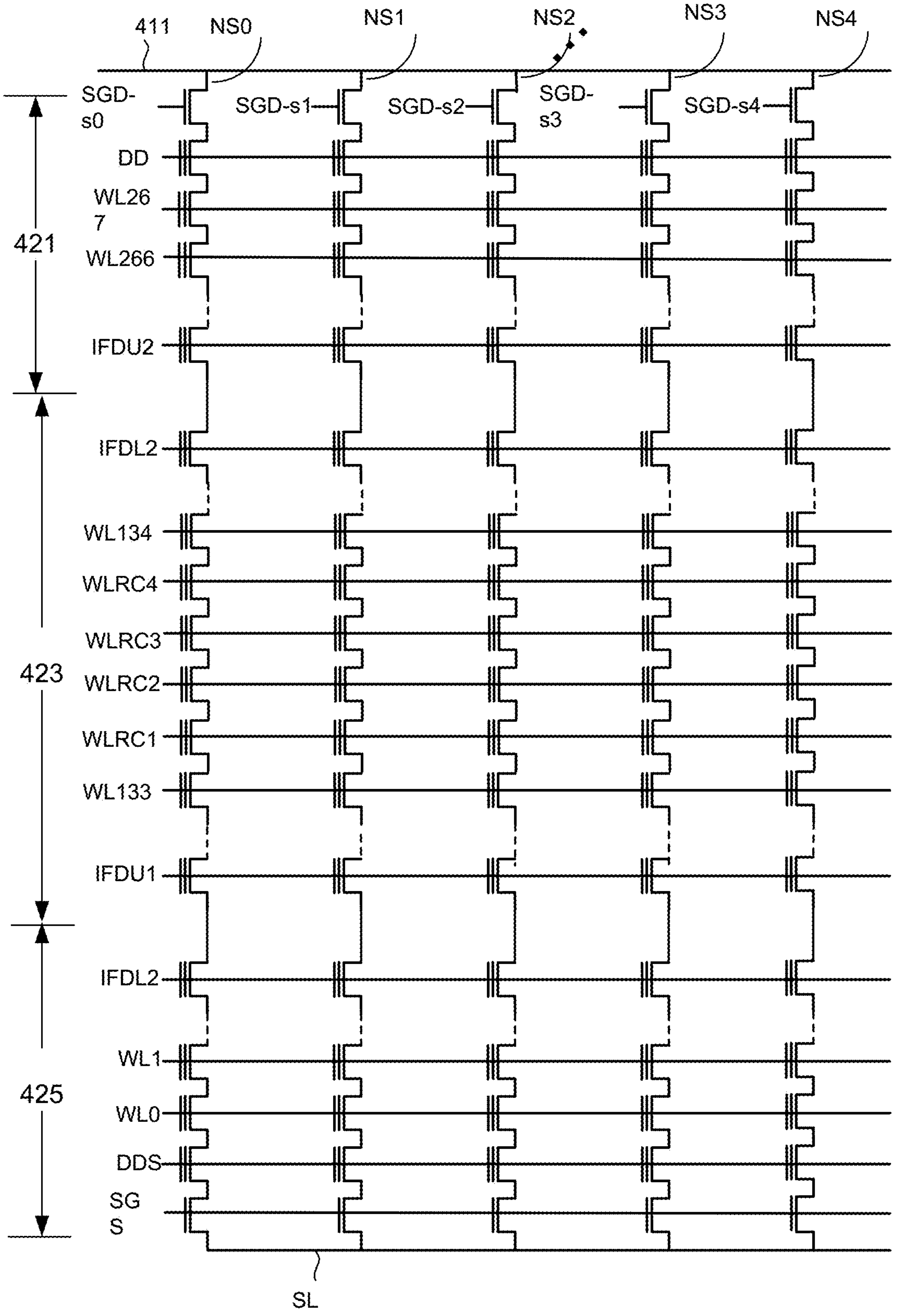
FIG. 4E is a schematic diagram of a portion of one embodiment of a block, depicting several NAND strings.

FIG. 4E is a schematic diagram of a portion of the memory depicted in FIGS. 4-4D. FIG. 4E shows physical word lines WL0-WL267 running across the entire block. The structure of FIG. 4E corresponds to portion 407 in Block 2 of FIGS. 4A-4B, including bit lines 411, 412, 413, 414, . . . 419. Within the block, each bit line is connected to five NAND strings. Drain side selection lines SGD-s0, SGD-s1, SGD-s2, SGD-s3 and SGD-s4 are used to determine which of the five NAND strings (NS0, NSL, NS2, NS3, NS4) connects to the associated bit line. Other NAND strings of the block and other bit lines are not depicted in FIG. 4E. A first finger corresponds to those vertical NAND strings controlled by SGD-s0. A second finger corresponds to those vertical NAND strings controlled by SGD-s1. A third finger corresponds to those vertical NAND strings controlled by SGD-s2. A fourth finger corresponds to those vertical NAND strings controlled by SGD-s3. A fifth finger corresponds to those vertical NAND strings controlled by SGD-s4. There may be more or fewer than five fingers in a block.

A source side selection line SGS connects/disconnects the NAND strings to/from the common source line. In some embodiments, there is a source side selection line for each finger (similar to the five SGD-s0, SGD-s1. SGD-s2, SGD-s3 and SGD-s4. The block can also be thought of as divided into five fingers: Finger 0, Finger 1, Finger 2. Finger 3, Finger 4. Finger 0 corresponds to those vertical NAND strings controlled by SGD-s0, Finger 1 corresponds to those vertical NAND strings controlled by SGD-s1, Finger 2 corresponds to those vertical NAND strings controlled by SGD-s2, Finger 3 corresponds to those vertical NAND strings controlled by SGD-s3, and Finger 4 corresponds to those vertical NAND strings controlled by SGD-s4. Note that the term "finger" in this context refers to regions that each contain entire NAND strings (but a subset of NAND strings in the block). In some embodiments, there is a sub-block mode in which each sub-block contains only a portion of each NAND string (see the tiers 421, 423, 425).

Although the example memories of FIGS. 4, 4B-4E are three dimensional memory structure that includes vertical NAND strings with charge-trapping material, other memory structures can also be used with the technology described herein.

Figure 5A:
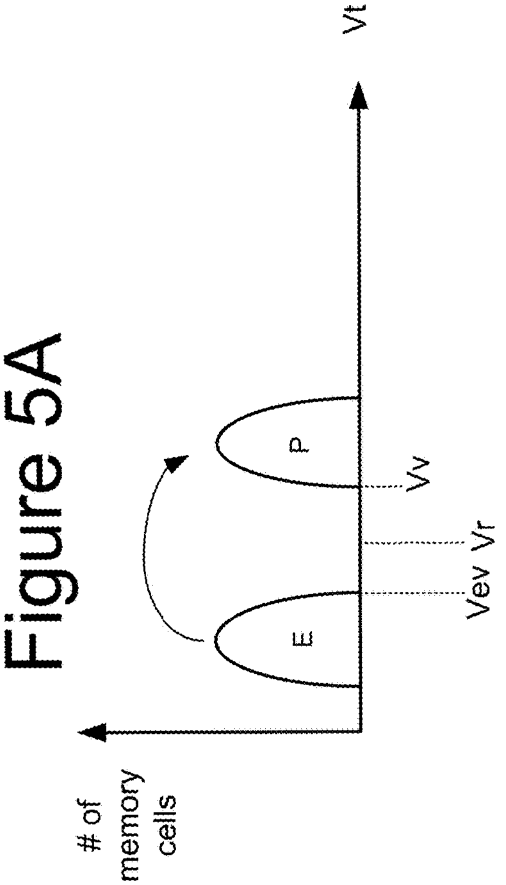
FIGS. 5A, 5B and 5C depict threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine whether a memory cell is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
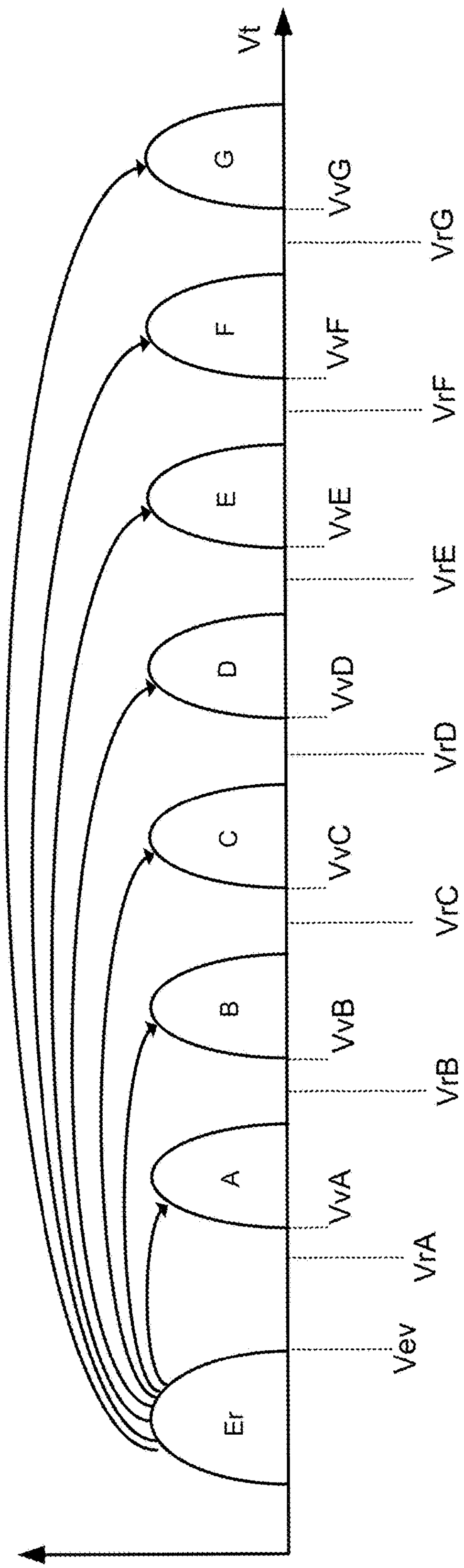

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 5C:
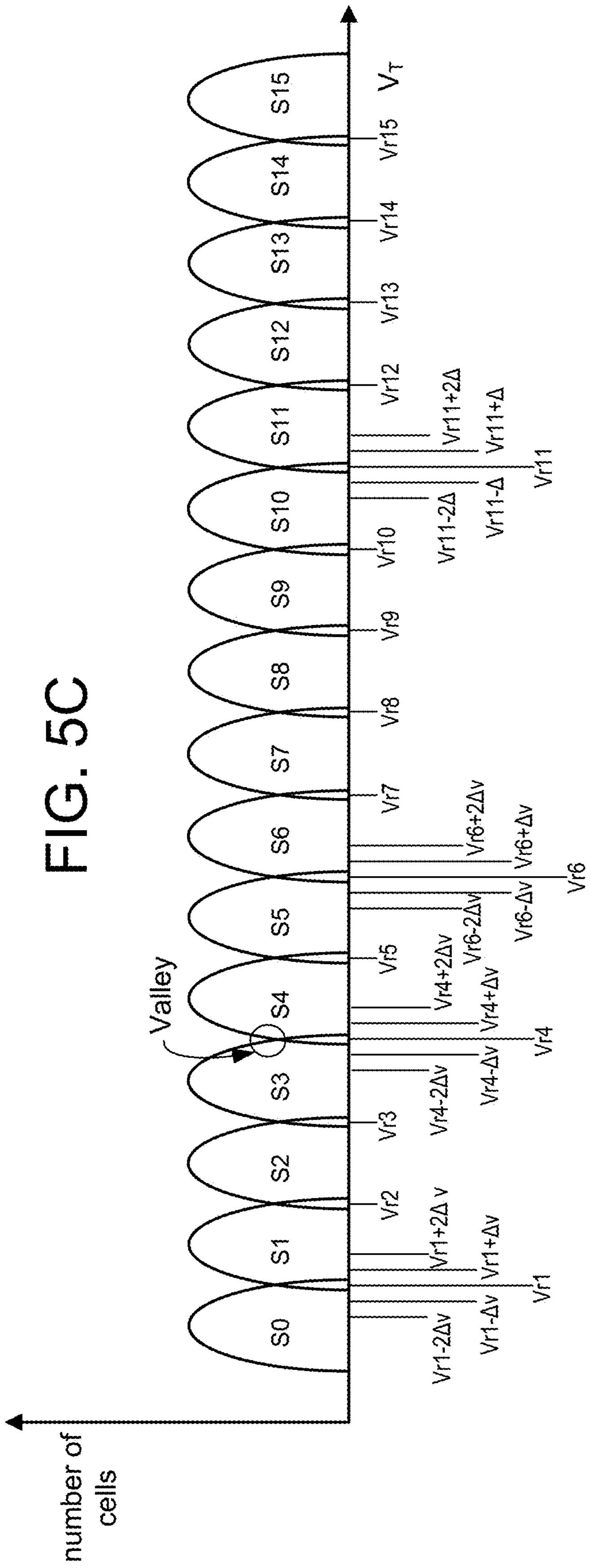

FIG. 5C illustrates example threshold voltage distributions for the memory array when each memory cell stores four bits of data. Other embodiments, however, may use other data capacities per memory cell (e.g., such as one, two, three, or five bits of data per memory cell). FIG. 5C shows 15 read reference voltages, Vr1-Vr15 for reading data from memory cells. The set of memory cells may be connected to the same word line. Each read reference level is used to distinguish between two adjacent threshold voltage distributions. Stated another way, each read reference level is used to distinguish between two adjacent data states. For example, read reference level Vr4 is used to distinguish between data states S3 and S4. Each read reference voltages Vr1-Vr15 used to distinguish between two adjacent threshold voltage distributions may be referred to herein as a "hard bit" reference voltage. By testing (e.g., performing sense operations) whether the threshold voltage of a given memory cell is above or below the 15 read reference voltages, the system can determine what data state (i.e., S0, S1, S2, S3) a memory cell is in. Note that FIG. 5A also shows an example of a "hard bit" reference voltage (Vr). Likewise, FIG. 5B also shows examples of a "hard bit" reference voltages (VrA, VrB. VrC. VrD, VrE, VrF. VrG).

FIG. 5C depicts that there may be some overlap between the data states S0-S15. The overlap may occur due to factors such as memory cells losing charge (and hence dropping in threshold voltage). FIG. 5C depicts an example in which four bits are stored per memory cell. Thus, four pages may be stored in a set of memory cells. The set of memory cells may be connected to the same word line. These pages may be referred to as a lower page, lower-middle page, upper-middle page, and upper page. In one embodiment, in order to read the lower page, the memory cells are sensed using four different read reference voltages. For example, the memory cells may be sensed at Vr1, Vr4, Vr6, and Vr11 to read one of the pages.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Over time, the locations of the threshold voltage distributions may change. A factor in this change may be programming and/or erasing memory cells in another tier in the block. Such changes can increase the bit error rate, thereby increasing decoding time or even making decoding impossible. In one embodiment, adjusting the reference levels may be used to compensate for the change in the locations of the Vt distributions. One technique for adjusting the reference levels is to change the magnitude of the read reference voltages. For example, the magnitude of one or more of the hard bit reference voltages (Vr1 Vr15) may be dynamically updated. In some embodiments, the memory cells are read at a set of reference voltages that includes a hard bit reference voltage and offsets to the hard bit reference voltage in a process of dynamically updating the hard bit reference voltage. FIG. 5C shows examples of a set of reference voltages such as Vr1−2Δv, Vr1−Δv, Vr1+Δv, and Vr1+2Δv near the Vr1 reference voltage. In some techniques, the memory cells are sensed at this set of reference voltages, with an analysis of the sensing results being used to select a new magnitude for the hard bit reference voltage. One technique for calibrating read reference voltages is to look for a valley, such as the valley between S3 and S4. In FIG. 5C, the valley is depicted at Vr4, but if the valley is at, for example, Vr4−Δv, then Vr4−Δv could be selected as the new magnitude for Vr4. Another technique for calibrating read reference voltages is to form codewords based on data read using a set of reference levels that includes a base reference and offsets from the base (e.g., Vr1−2Δv, Vr1−Δv, Vr1, Vr1+Δv, Vr1+2Δv) and analyze any error metric such as bit error rate (BER) or syndrome weight (SW). Note that if there has been a large shift in the valley, then the scan could miss the valley. Potentially, more reference voltages could be used in the scan, but this requires additional time.

Potentially, the Δv could be made larger, but this comes at the expense of loss of granularity. In an embodiment, the set of voltages used in a scan to, for example, look for the valley or use for BER analysis depends on the programmed/erased states of other tiers in the block.

Figure 6A:
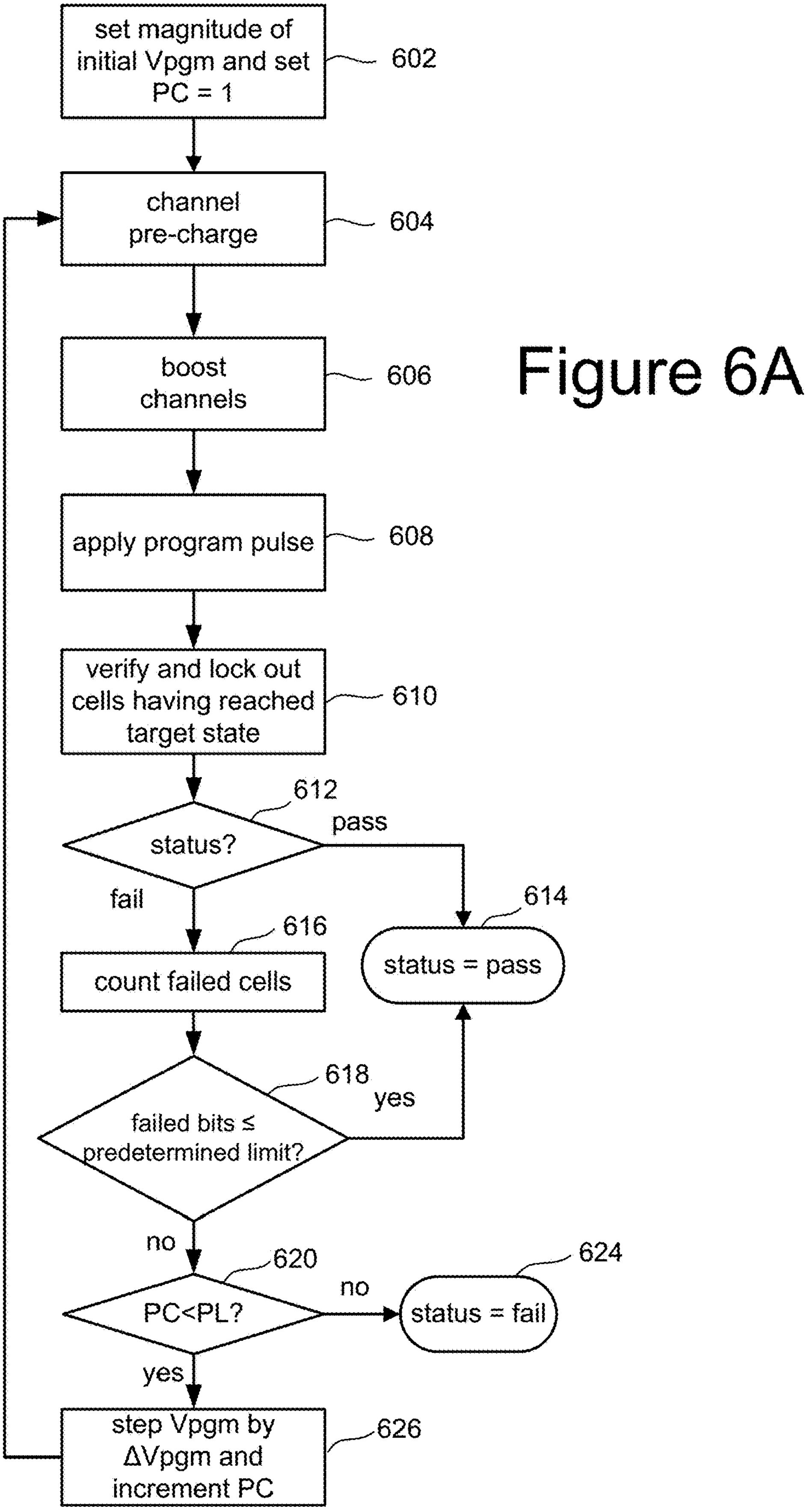
FIG. 6A is a flowchart describing one embodiment of a process for programming memory cells.

FIG. 6A is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6A is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses a set of verify pulses (e.g., voltage pulses) may be used to perform verification. In many implementations, the magnitude of the program pulses is increased with each successive pulse by a predetermined step size. In step 602 of FIG. 6A, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of memory cells from state P to state E of FIG. 5A, from states A-G to state Er of FIG. 5B, or from states S1-S15 to state Er of FIG. 5C.

In embodiments, a partial block erase is performed to erase tiers (or sub-blocks) independently). A partial block erase operation may be performed by biasing word lines within a selected tier to be erased with an erase enable voltage (e.g., 0V, 05V) while biasing other word lines in the other tiers that are not to be erased with an erase inhibit voltage high voltage (e.g., 15V) and providing an erase voltage to NAND channels in the block.

One technique to erase memory cells is to bias a p-well substrate to a high voltage to charge up a NAND channel. An erase enable voltage is applied to control gates of memory cells to be erased while the NAND channel is at a high voltage to erase the memory cells. In one embodiment, a p-well erase is performed. In some cases, the NAND strings within a block may share a common well (e.g., a p-well). In a p-well erase, holes may be provided from the p-well in the substrate below the NAND strings. In one embodiment, memory cells may be erased by raising the p-well to an erase voltage (e.g., 20 volts) for a sufficient period of time and grounding the word lines connected to memory cells to be erased. These erase bias conditions may cause electrons to be transferred from the charge-trapping layer or film 463 through the tunneling oxide 464, thereby lowering the threshold voltage of the memory cells within the selected block.

Another approach to erasing memory cells is to generate gate induced drain leakage (GIDL) current to charge up the NAND string channel. An erase enable voltage is applied to control gates of the memory cells, while maintaining the string channel potential to erase the memory cells. The GIDL current is generated by causing a drain-to-gate voltage at a select transistor, in one embodiment. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel 465, thereby raising the potential of the channel 465. The other type of carriers, e.g., electrons, are extracted from the channel 465, in the direction of a bit line or in the direction of a source line, by an electric field. During erase, the holes may tunnel from the channel to a charge storage region 463 of memory cells and recombine with electrons there, to lower the threshold voltage of the memory cells.

Figure 6B:
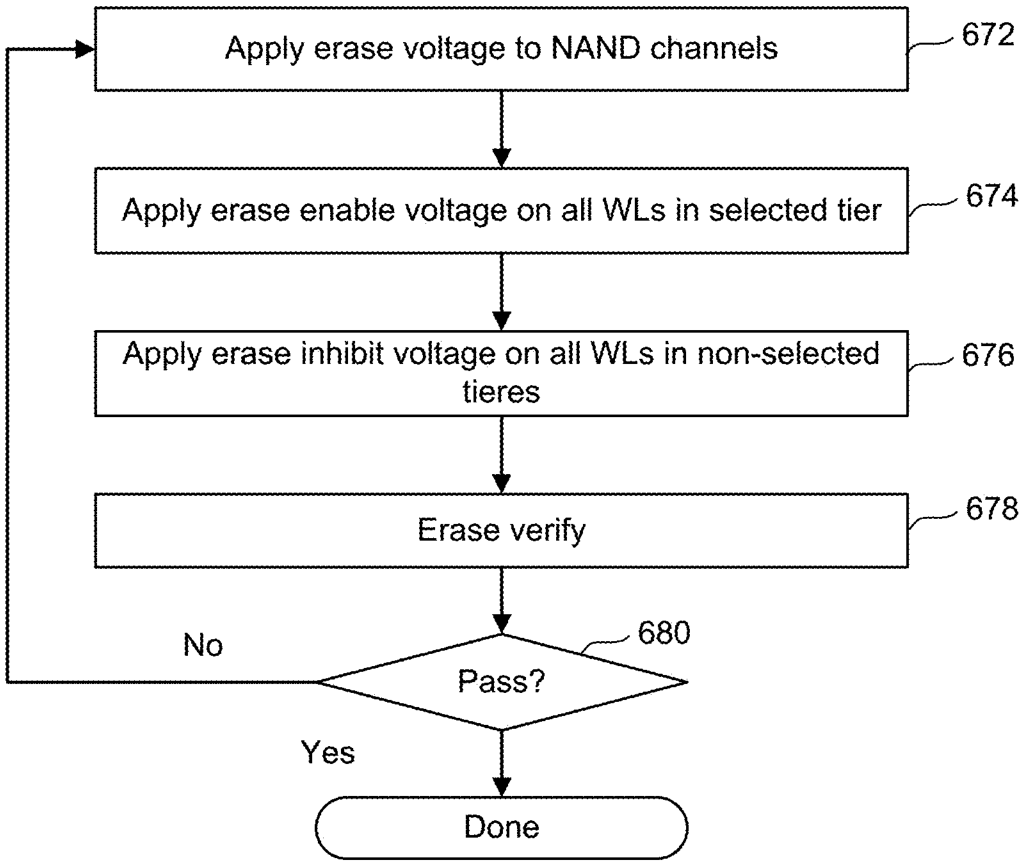
FIG. 6B depicts one embodiment of a partial-block erase process.

FIG. 6B depicts one embodiment of a partial-block erase process. The process may be used to erase one tier of a block independent of other tiers. Step 672 includes applying the erase voltage to the channels of the NAND strings in the block. In one embodiment, the erase voltage is applied to a P-well in the substrate to charge the channels of the NAND strings in the block. In a GIDL erase embodiment, the erase voltage is applied to the bit lines and/or source line while a voltage is applied to SGD and/or SGS to generate the aforementioned GIDL current. Step 674 includes applying the erase enable voltage to all WLs in the selected tier. Step 676 includes applying an erase inhibit voltage to all word lines in the non-selected tier. Therefore, the voltages applied in steps 672-676 will erase the memory cells in the selected tier without erasing the non-selected tiers. Step 678 includes an erase verify. The erase verify may apply for example VvEr (See FIGS. 5A-5B) to each WLs in the selected tier. A pass voltage, having a magnitude higher than the highest memory cell Vt, may be applied to all WLs in the unselected tiers. If all memory cells in the selected tier on a NAND string have a Vt below VvEr then the NAND string will conduct a significant current. In some embodiments, if a NAND string passes erase of the NAND string may end at this point. Step 680 is a determination of whether erase is complete. Optionally, the magnitude of the erase voltage may be increased each iteration. When all NAND strings have passed erase the process ends. In some embodiments, erase may end with a few NAND strings having yet to pass erase.

Figure 7:
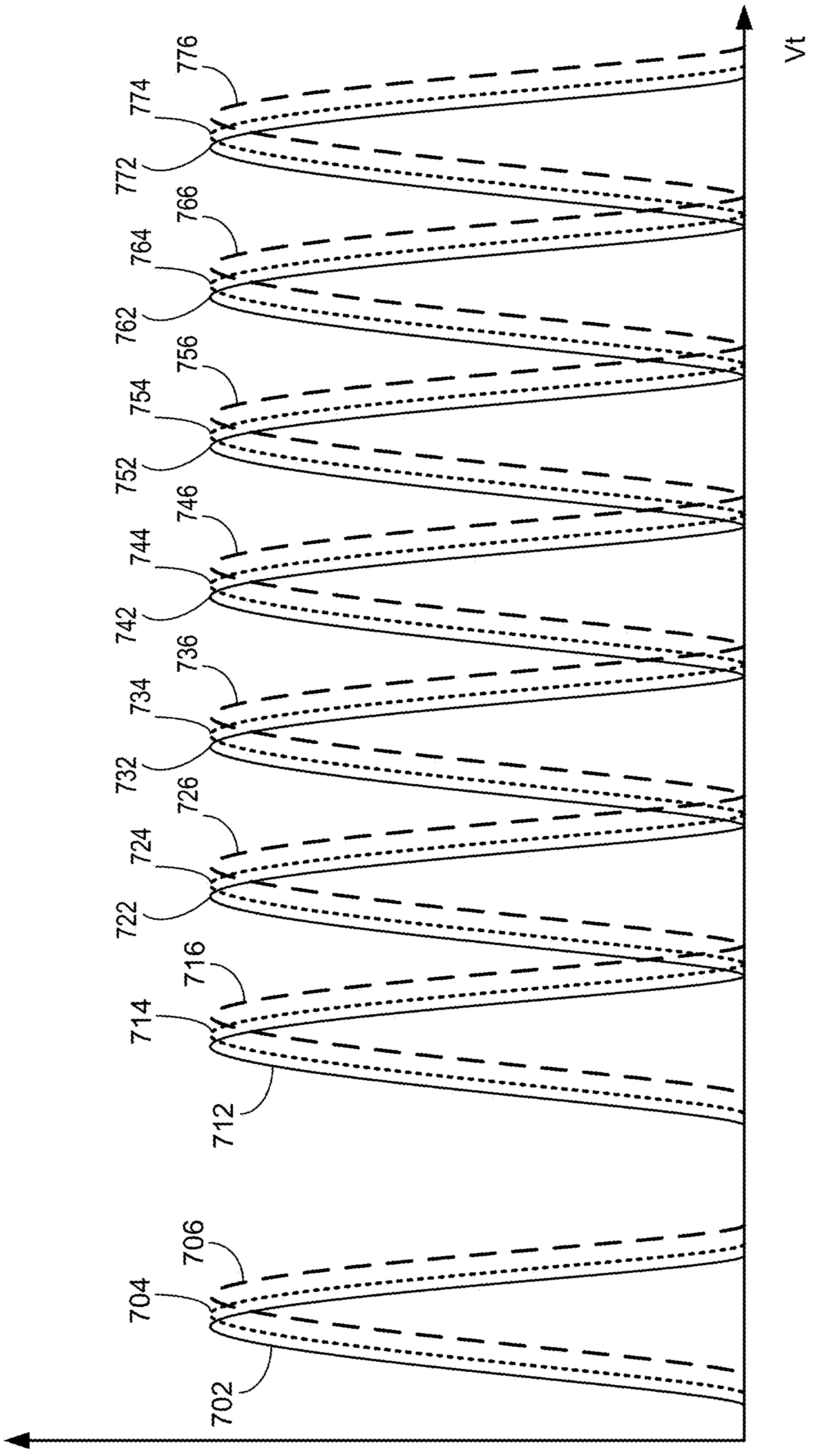
FIG. 7 depicts threshold voltage distributions for memory cells on a word line in a block.

The programmed/erased states of other sub-blocks can impact the Vt of a sub-block selected for read. FIG. 7 depicts threshold voltage distributions for memory cells on a word line in a block. The word line could be, for example, WL0. This is a three bit per cell example in which the memory cells are either in the erased state or in one of seven programmed states. There are three set of voltage distributions for the memory cells. One is the Vt distributions (702, 712, 722, 732, 742, 752, 762, 772) of the cells on WL0 just after programming. A second is the Vt distributions of WL0 (704, 714, 724, 734, 744, 754, 764, 774) after programming a word line near the middle of block. A third is the Vt distributions of WL0 (706, 716, 726, 736, 746, 756, 766, 776) after programming a word line near the top of block. The Vt distributions show a shift in the Vt of the memory cells on WL0 after programming the other word lines in the block. Note that additional word lines in the block may also be programmed after WL0 in addition to the two just mentioned. Therefore, the Vt shift may be due to programming many word lines in the block. Significantly, the Vt of memory cells in one tier may depend on the programmed/erased states of memory cells in the other tiers.

An embodiment of a memory system determines and applies one or more read parameters within a tier that depends on the programmed/erased states of other tiers in the block. The read parameter may compensate for Vt shifts. FIG. 8 depicts a table 800 of programmed/erased states for either tiers when a tier is being read. In this example, each tier is either fully programmed (all WLs in tier programmed) or fully erased (all WLs in tier erased). The notation "Read (programmed) means that the tier has been fully programmed and some group of memory cells in the tier is to be read. For the three tier example, there are four possible programmed/erased combinations for the other tiers: Erased/Erased, Erased/Programmed, Programmed/Erased. or Programmed/Programmed. Each of these four possible programmed/erased combinations could affect the Vts of the cells in the selected tier differently. In an embodiment, offline characterizations may be performed to learn how each of the four possible programmed/erased combinations impact the Vts of the selected tier. Then, one or more read parameters may be determined to handle the impact on the Vts in the selected tier. In one embodiment, offsets to default read reference levels (see examples of default read reference levels in FIGS. 5A, 5B, 5C are determined for the four possible programmed/erased combinations.

FIG. 9 depicts a read parameter table 900 containing example offsets to read reference levels for a three tier example. If SB0 is being read, then there are four possible programmed/erased combinations for SB1 and SB2, which are shown in the read parameter table 900. The read parameter table 900 contains a different read offset for each of the four possible programmed/erased combinations. Likewise, if SB1 is being read, then there are four possible programmed/erased combinations for SB0 and SB2, which are shown in the read parameter table 900. The offset table 900 contains a different read offset for each of these four possible programmed/erased combinations. Likewise, if SB2 is being read, then there are four possible programmed/erased combinations for SB0 and SB1, which are shown in the read parameter table 900. The read parameter table 900 contains a different read offset for each of these four possible programmed/erased combinations. The read parameter table 900 may be modified to handle more or fewer than three tiers. Also, an offset to a read reference level is one example of a read parameter that may depend on the programmed/erased states of other tiers; however, other read parameters may depend on the programmed/erased states of other tiers. Moreover, the offsets to the read reference level may be used in a variety of ways. In one embodiment, the offsets are used to adjust the default read reference level for a normal read. In one embodiment, the offsets in a process that dynamically adjusts the read reference level. In one embodiment, the offsets are used in a bit error rate estimation scan (BES). Briefly, the BES may include sensing memory cells using a set of reference voltages, and then determining an error metric for codewords derived from the sensing. The error metric may be, for example, a syndrome weight (SW) or a bit error rate (BER).

In the examples in the tables in FIGS. 8 and 9, the non-selected tiers may be considered to be either fully programmed or fully erased. In some techniques, the various tiers will typically be in either the fully programmed or fully erased state. However, the concept in the tables in FIGS. 8 and 9 can be extended to cover cases in which the other tiers are not either fully programmed or fully erased. In one embodiment, additional rows can be added to table 900 to cover additional combinations that involve the other tiers being partially programmed. Furthermore, in the examples in the tables in FIGS. 8 and 9 there are three tiers in a block. The concept in the tables in FIGS. 8 and 9 can be extended to cover cases in which there are more or fewer than three tiers in a block.

Figure 10:
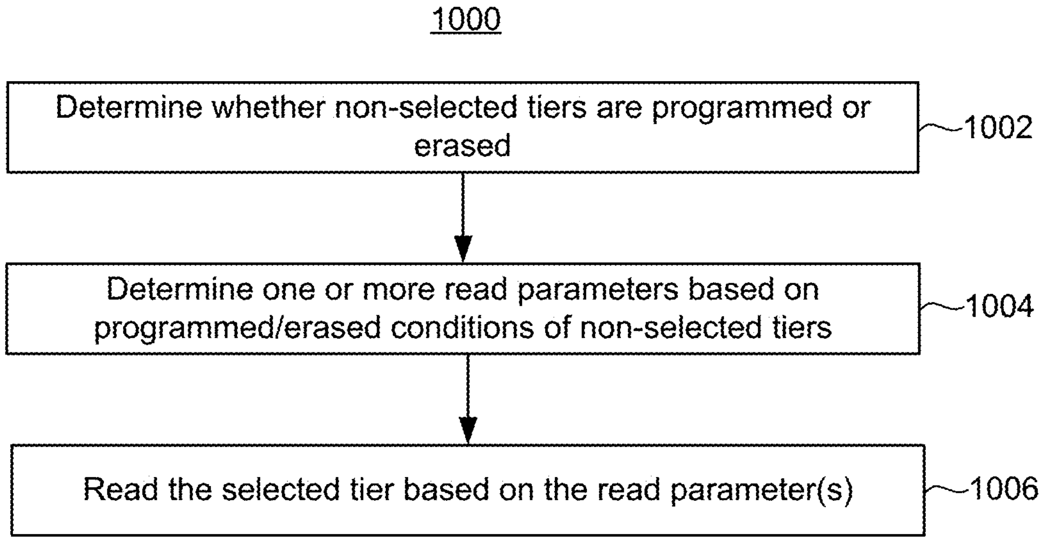
FIG. 10 is a flowchart of one embodiment of a process of reading in multi-tier memory using a read parameter that is based on programmed/erased states in non-selected tiers.

FIG. 10 is a flowchart of one embodiment of a process 1000 of reading in multi-tier memory using one or more read parameters that are based on programmed/erased states in non-selected tiers. Step 1002 includes determining whether non-selected tiers are programmed or erased. This determination may be made in a number of ways. In one embodiment, a group of cells are read to check if a not insignificant number of cells have a Vt in a programmed state. However, other techniques could be used. In an embodiment, the memory controller 120 may maintain a list of erased sub-blocks that are ready to be programmed.

Step 1004 includes determining one or more read parameters based on the programmed/erased states of the non-selected tiers. As one example, table 900 in FIG. 9 may be used to determine read offsets. In one embodiment, the one or more read parameters comprise a magnitude of a reference signal. The reference signal may be used as a reference when reading memory cells. The reference signal may be used to determine whether a memory cell has a Vt above or below a certain voltage. In one embodiment the reference signal is a reference voltage that may be applied to the selected word line (and hence control gates of selected memory cells). In one embodiment, the one or more read parameters includes a magnitude for a read reference voltage used to read a "hard bit" such as Vr (see, for example. FIG. 5A), one or more of VrA-VrG (see, for example, FIG. 5B) or one or more of Vr1-Vr1 (see, for example, FIG. 5C. The one or more read parameters are not limited to read reference voltage used to read a "hard bit." The read parameter(s) may include, or be used to determine, magnitudes for a set of reference voltages such as the set: Vr1−2Δ, Vr1−Δ, Vr1, Vr1+Δ, Vr1+2Δ (and/or the sets around other reference voltages such as Vr4, Vr6, and/or Vr11). For example, the one or more read parameters may be used to determine Vr1, Vr4, Vr6, Vr11 and/or Δ. In some embodiments, such a set of reference voltages are used in a BES to determine new read levels (e.g., determine a new value for Vr1).

Step 1006 includes reading the selected tier based on the read parameter(s). In one embodiment, the aforementioned reference signal is used to read the selected memory cells in the selected tier. In one embodiment, a read reference voltage is applied to a selected word line in the selected tier during the read. In one embodiment, the results of reading the memory cells are used to dynamically adjust the present read reference levels. In one embodiment, the results of reading the memory cells are used in a BES that dynamically adjusts the present read reference levels.

Figure 11:
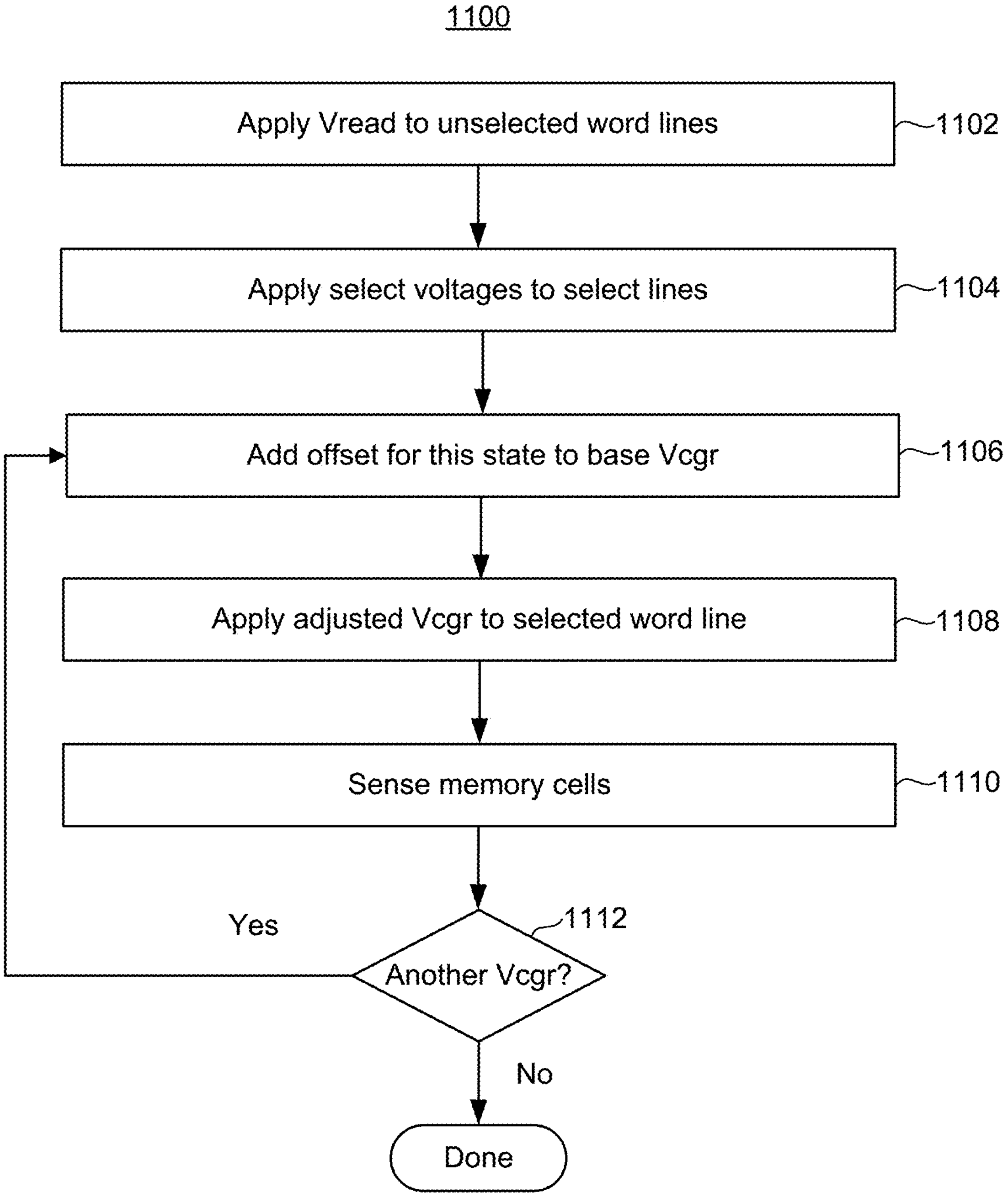
FIG. 11 is a flowchart of one embodiment of a process reading memory cells in a selected tier using read reference voltages determined based on programmed/erased states of other (unselected) tiers in the block.

FIG. 11 is a flowchart of one embodiment of a process 1100 reading memory cells in a selected tier using read reference voltages determined based on programmed/erased states of other (unselected) tiers in the block. Process 1100 provides further details for one embodiment of step 1006 in FIG. 10. Process 1100 may be performed by one or more control circuits on memory die 200 or control die 211. Step 1102 includes applying Vread to unselected word lines in the block. The voltage Vread has a higher magnitude that the highest expected Vt in the block. Step 1104 includes applying select voltages to select lines of the block. The select voltage applied to SGD connects the NAND channel to the bit lines for sensing any current conducted by the selected memory cells. The select voltage applied to SGS connects the NAND channels to the source line.

Steps 1106-1110 are performed for one or more different read levels. In one embodiment, steps 1106-1110 are performed to read a page of data, which may involve one, two, three, four or more reads, depending on the coding scheme and number of bits per cell. For example, with reference to FIG. 5C one of the pages may be read by applying Vr1, Vr4, Vr6, and Vr11 to the selected word line.

Step 1106 includes adding the offset to the base Vcgr for this state. Here, the offset may be positive or negative. Note that this offset may be one of the read parameters or may be determined from one of the read parameters in step 1004 of FIG. 10. Note that the offsets may be state dependent, but that is not required. As an example, Vr1 (see FIG. 5C may be shifted up or down based on the magnitude of the offset. Step 1108 includes applying the adjusted Vcgr to the selected word line. Step 1110 includes sensing the memory cells. Step 1112 includes determining whether there is another read level. If so, the process returns to step 1106 to add the offset for the next state to the based Vcgr. After process 1100 is completed, a single bit may be determined for each memory cell based on the sensing results. The single bit thus indicates whether the memory cells is a "1" or a "0" for this page. An ECC algorithm may then be used to decode and error correct the page. In an embodiment, the die (200, 211) sends the page to the memory controller 120, which uses ECC engine 158 to decode and error correct the page. In some embodiments, the die (200, 211) has an ECC engine to decode and error correct the page.

Figure 12:
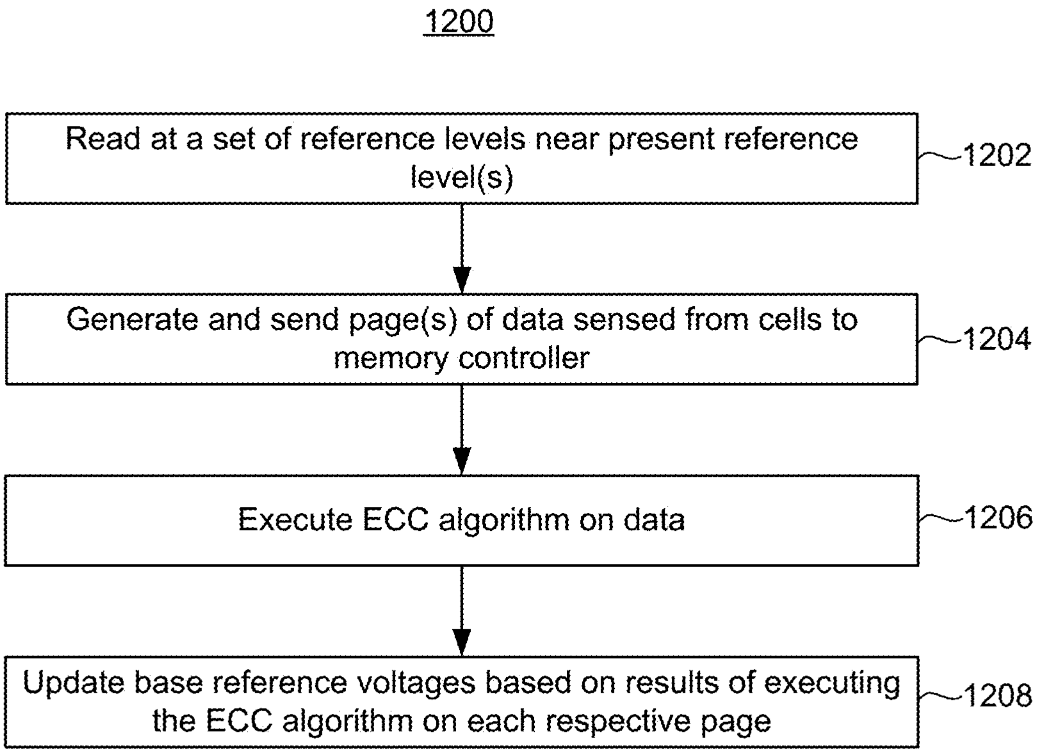
FIG. 12 is a flowchart of one embodiment of a process of dynamically updating read reference levels for a selected tier based on results of reading using read parameters determined based on programmed/erased states of other tiers.

The read parameters are not limited to being those used to sense at "hard bit voltages." In one embodiment, the read parameters are used to sense at a set of reference voltages in order to dynamically update the hard bit reference voltages. FIG. 12 is a flowchart of one embodiment of a process 1200 of dynamically updating read reference levels for a selected tier based on results of reading using read parameters determined based on programmed/erased states of other tiers. The process 1200 may be used in one embodiment of step 1006 in FIG. 10. Step 1202 includes reading at a set of reference voltages near the present reference voltage(s). Using FIG. 5C as an example, reading may be performed at present reference voltage for Vr1, Vr4, Vr6, and Vr11, as well as deltas (e.g., Vrx−2Δ, Vrx−Δ, Vrx+Δ, Vrx+2Δ, where rx is Vr1, Vr4, Vr6, or Vr11). Note that the magnitude for Vr1, Vr4, Vr6, and/or Vr11, as well as A may be determined based on the programmed/erased states of the other tiers in the block.

Step 1204 includes generating one or more pages of data from the sensing in step 1202. In the example based on FIG. 5C, five pages of data may be generated. One page may be from the "base" reference voltages (Vr1, Vr4, Vr6, or Vr11), and one page each of the four respective A's from the base. In one embodiment, six A's are used (referred to as BES7). The pages of data are sent to the memory controller 120.

Step 1206 includes executing an ECC algorithm on each separate page of data. This step may result in a bit error rate, an estimation of a bit error rate, a syndrome weight, or some other decoding metric for each page.

Step 1208 includes updating the base reference voltages based on results of executing the ECC algorithm on each respective page. In one embodiment, the reference levels that produced the "best" decoding metric are selected. For example, the reference levels that results in the lowest actual bit error rate, lowest estimated bit error rate, or lowest syndrome weight are selected for the new base reference levels. In one embodiment, interpolation may be used to select values between two of the sets that each had similar decoding results.

Figure 13:
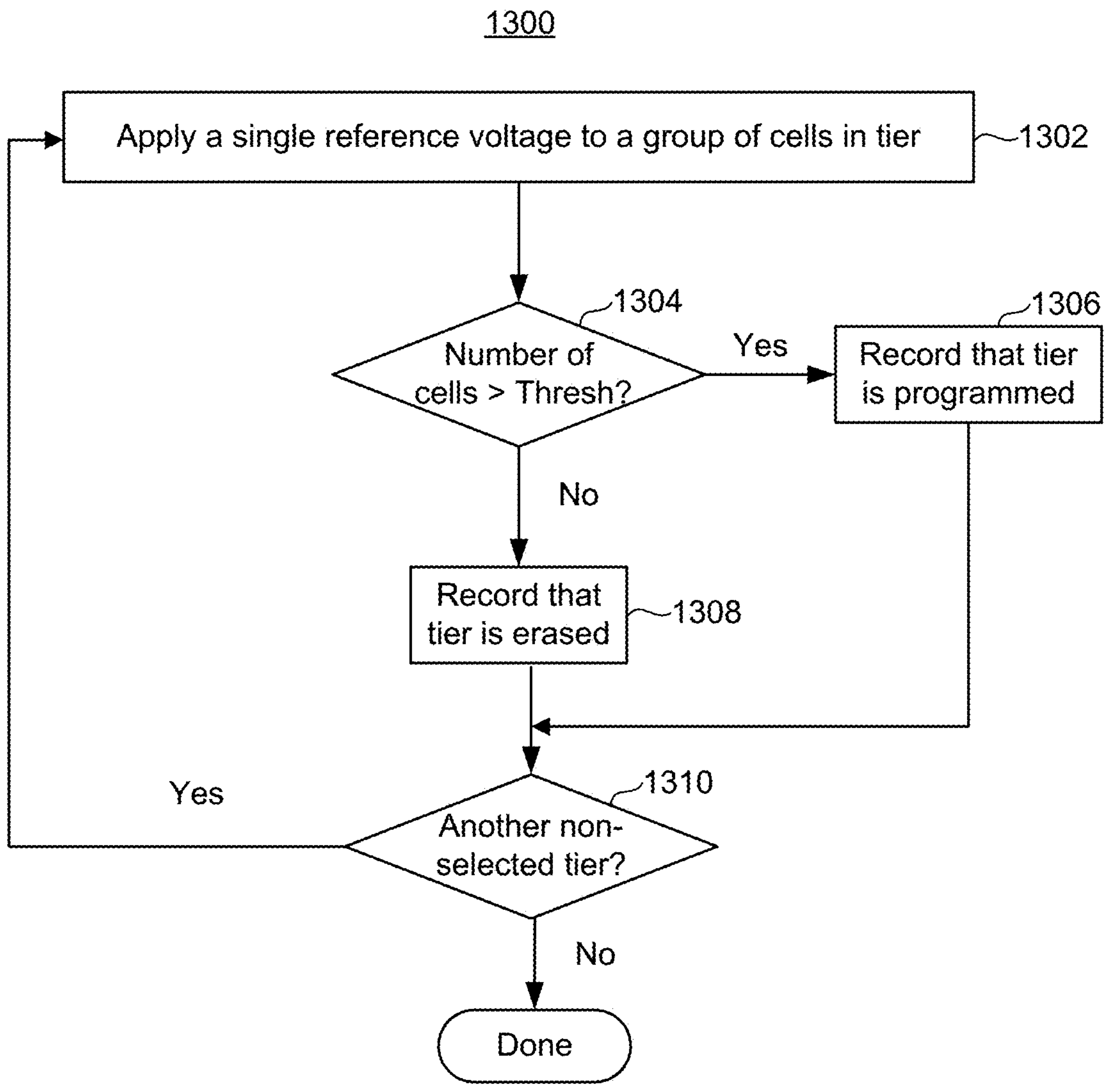
FIG. 13 is a flowchart of one embodiment of a process of determining whether other tiers are programmed or erased.

FIG. 13 is a flowchart of one embodiment of a process 1300 of determining whether other tiers are programmed or erased. Process 1300 provides further details for one embodiment of step 1002 in FIG. 10. Step 1302 includes applying a single reference voltage to a group of memory cells in a tier in the block other than the tier to be read. The single reference voltage could be a read reference voltage including, but not limited to, those depicted in FIG. 5A (Vr), FIG. 5B (VrA-VrG) or FIG. 5C (Vr1-Vr15). However, the single reference voltage is not limited to a voltage that is used as a reference between two Vt distributions.

Step 1304 includes counting the number of cells having a Vt above the reference voltage. This count need not be a count of every cell in that counting may stop if a certain number is reached. If the memory cells have been programmed then a substantial number of cells should have a Vt above the reference voltage. In this case, then in step 1306 the system records that the tier is programmed. If the memory cells have not been programmed (i.e., still erased) then not more than an insignificant number of cells should have a Vt above the reference voltage in which case in step 1308 the system records that the tier is erased. Step 1310 is a determination of whether there is another non-selected tier to evaluate. Process 1300 is able to quickly and accurately determine the programmed/erased states of the other tiers.

In view of the foregoing, a first embodiment includes an apparatus comprising one or more control circuits configured to communicate with a three-dimensional array of non-volatile memory cells. The non-volatile memory cells are arranged in blocks. The blocks are divided into multiple tiers with each tier comprising a set of word lines. The one or more control circuits configured to erase the multiple tiers in respective blocks separately. The one or more control circuits configured program memory cells in respective tiers after the respective tiers have been erased. The one or more control circuits configured determine one or more read parameters based on a programmed/erased state of at least one non-selected tier in a selected block having a tier selected for read. The one or more control circuits configured to read selected memory cells in the selected tier using the one or more read parameters.

In a further embodiment, each block comprises NAND strings and word lines. And the word lines in a block are connected to control gates of memory cells on the NAND strings.

In a further embodiment, the one or more read parameters comprise a magnitude of a reference signal. And the one or more control circuits are further configured to use the reference signal to read the selected memory cells in the selected tier.

In a further embodiment, the or more read parameters comprise a magnitude of a read reference voltage. And the one or more control circuits are further configured to apply the read reference voltage to a selected word line in the selected tier during the read of the selected memory cells in the selected tier. The selected word line is connected to the selected memory cells.

In a further embodiment, the one or more read parameters comprise a set of reference voltages that includes a base reference voltage to distinguish between two data states and offsets to the base reference voltage. And the one or more control circuits are further configured to apply the set of reference voltages to a selected word line in the selected tier during the read of the selected memory cells in the selected tier. The selected word line connected to the selected memory cells.

In a further embodiment, the one or more control circuits configured to update the base reference voltage for the selected tier based on results of reading the selected memory cells in the selected tier using the set of reference voltages.

In a further embodiment, each block comprises at least three tiers. And the one or more control circuits are further configured to determine the one or more read parameters based on a pattern of fully erased or fully programmed tiers in the selected block.

In a further embodiment, each block comprises at least three tiers. And the one or more control circuits are further configured to read at a single reference voltage in the non-selected tiers to determine whether the at least one non-selected tier is programmed or erased.

In a further embodiment, each block comprises at least three tiers. And the one or more control circuits are further configured to read a single word line in each non-selected tier to determine whether the non-selected tiers are programmed or erased.

In a further embodiment, each block comprises at least three tiers. And the one or more control circuits are further configured to read the selected memory cells in the selected tier using the one or more read parameters when the selected tier is fully programmed and the non-selected tiers are either fully programmed or fully erased.

One embodiment includes a method for operating non-volatile storage. The method comprises erasing sub-blocks of memory cells independently within blocks comprising memory cells on NAND strings, wherein each block is divided into at least three sub-blocks with each sub-block comprising a different portion of each NAND string in the block. The method comprises programming respective sub-blocks of memory cells after the respective sub-blocks have been erased. The method comprises determining one or more read reference levels for a selected sub-block in a selected block based on whether the other sub-blocks in the selected block are programmed or erased. The method comprises applying the one or more read reference levels to control gates of selected memory cells in the selected sub-block to read the selected memory cells.

One embodiment includes a non-volatile storage system. The system comprises a three-dimensional array of non-volatile memory cells. The non-volatile memory cells are arranged in blocks. The blocks are divided into multiple tiers. The system comprises erase means for erasing multiple tiers in each block separately. The system comprises program means for programming each word line in each tier after the tier has been erased. The system comprises read parameter means for determining one or more read parameters that depend on whether non-selected tiers in a selected block are erased or programmed. The system comprises read means for applying the one or more read parameters to selected memory cells in a selected tier of the selected block to read the selected memory cells.

In a further embodiment of the volatile storage system, the blocks comprises NAND strings. In a further embodiment of the volatile storage system each tier comprises a portion of each NAND string in the block. In a further embodiment of the volatile storage system each respective block comprises fabrication joints that provide a conductive connection between NAND channels in one tier of the respective block with NAND channels in another tier of the respective block.

In an embodiment, the erase means for erasing multiple tiers in each block separately comprises one or more of memory controller 120, system control logic 260, state machine 262, column control circuitry 210, row control circuitry 220, a processor, an FPGA, an ASIC, and/or an integrated circuit. In an embodiment, the erase means performs the process of FIG. 6B.

In an embodiment, the program means for programming each word line in each tier after the tier has been erased comprises one or more of memory controller 120, system control logic 260, state machine 262, column control circuitry 210, row control circuitry 220, a processor, an FPGA, an ASIC, and/or an integrated circuit. In an embodiment, the program means performs the process of FIG. 6A.

In an embodiment, the read parameter means for determining one or more read parameters that depend on whether non-selected tiers in a selected block are erased or programmed comprises one or more of memory controller 120, system control logic 260, state machine 262, column control circuitry 210, row control circuitry 220, a processor, an FPGA, an ASIC, and/or an integrated circuit. In an embodiment, the read parameter means performs the process of FIG. 12. In an embodiment, the read parameter means performs the process of FIG. 13.

In an embodiment, the read means for applying the one or more read parameters to selected memory cells in a selected tier of the selected block to read the selected memory cells comprises one or more of memory controller 120, system control logic 260, state machine 262, column control circuitry 210, row control circuitry 220, a processor, an FPGA, an ASIC, and/or an integrated circuit. In an embodiment, the read means performs the process of FIG. 11.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

one or more control circuits configured to communicate with a three-dimensional array of non-volatile memory cells, the non-volatile memory cells arranged in blocks, the blocks divided into multiple tiers with each tier comprising a set of word lines, the one or more control circuits configured to:

erase the multiple tiers in respective blocks separately;

program memory cells in respective tiers after the respective tiers have been erased;

determine one or more read parameters based on a programmed/erased state of every non-selected tier in a selected block having a tier selected for read, the programmed/erased state being whether the non-selected tier is fully programmed or fully erased; and read selected memory cells in the selected tier using the one or more read parameters, including read the selected memory cells in the selected tier at a read reference level that depends on the programmed/erased state of every non-selected tier in the selected block.

2. The apparatus of claim 1, wherein:

the one or more read parameters comprise a magnitude of a hard bit read reference voltage having a magnitude that depends on the programmed/erased state of every non-selected tier in the selected block; and the one or more control circuits are further configured to use the hard bit read reference voltage to read the selected memory cells in the selected tier.

3. The apparatus of claim 1, wherein:

the one or more read parameters comprise a magnitude of a hard bit read reference voltage having a magnitude that depends on the programmed/erased state of every non-selected tier in the selected block; and the one or more control circuits are further configured to apply the hard bit read reference voltage to a selected word line in the selected tier during the read of the selected memory cells in the selected tier, the selected word line connected to the selected memory cells.

4. The apparatus of claim 1, wherein:

each block comprises at least three tiers; and the one or more control circuits are further configured to determine the one or more read parameters based on a pattern of fully erased or fully programmed tiers in the selected block.

5. The apparatus of claim 1, wherein:

each block comprises at least three tiers; and the one or more control circuits are further configured to read at a single reference voltage in each of the non-selected tiers to determine whether each non-selected tier is fully programmed or fully erased.

6. The apparatus of claim 1, wherein:

each block comprises at least three tiers; and the one or more control circuits are further configured to read a single word line in each non-selected tier to determine whether the non-selected tiers are fully programmed or fully erased.

7. The apparatus of claim 1, wherein:

each block comprises at least three tiers; and the one or more control circuits configured to read the selected memory cells in the selected tier using the one or more read parameters when the selected tier is fully programmed and the non-selected tiers are either fully programmed or fully erased.

8. The apparatus of claim 1, wherein:

the one or more read parameters comprise a set of reference voltages that includes a base reference voltage to distinguish between two data states and offsets to the base reference voltage, a magnitude of the base reference voltage depends on the programmed/erased state of every non-selected tier in the selected block; and the one or more control circuits are further configured to apply the set of reference voltages to a selected word line in the selected tier during the read of the selected memory cells in the selected tier, the selected word line connected to the selected memory cells.

9. The apparatus of claim 8, wherein the one or more control circuits configured to:

update the base reference voltage for the selected tier based on results of reading the selected memory cells in the selected tier using the set of reference voltages.

10. The apparatus of claim 8, wherein the one or more control circuits configured to:

update the base reference voltage based on results of decoding data read using the set of reference voltages.

11. A method for operating non-volatile storage, the method comprising:

erasing sub-blocks of memory cells independently within blocks comprising memory cells on NAND strings, wherein each block is divided into at least three sub-blocks with each sub-block comprising a different portion of each NAND string in the block;

programming respective sub-blocks of memory cells after the respective sub-blocks have been erased;

determining one or more read reference levels for a selected sub-block in a selected block based on whether the other sub-blocks in the selected block are fully programmed or fully erased; and applying the one or more read reference levels to control gates of selected memory cells in the selected sub-block to read the selected memory cells.

12. The method of claim 11, wherein the one or more read reference levels comprise a corresponding one or more hard bit reference voltages.

13. The method of claim 11, wherein the one or more read reference levels comprise a set of reference voltages that includes a hard bit reference voltage and offsets to the hard bit reference voltage, and further comprising:

dynamically updating the hard bit reference voltages based on results of sensing using the set of reference voltages.

14. The method of claim 11, further comprising:

performing a single read operation in each of the other sub-blocks in the selected block to determine whether the other sub-blocks are fully programmed or fully erased.

15. A non-volatile storage system, the system comprising:

a three-dimensional array of non-volatile memory cells, the non-volatile memory cells arranged in blocks, wherein the blocks are divided into multiple tiers;

erase means for erasing multiple tiers in each block separately;

program means for programming each word line in each tier after the tier has been erased;

read parameter means for determining one or more read parameters that depend on whether non-selected tiers in a selected block are fully erased or fully programmed, the or more read parameters include at least one read reference voltage having a magnitude that depends on programmed/erase status of the non-selected tiers in the selected block, the programmed/erased status being whether the non-selected tier is fully programmed or fully erased; and read means for applying the one or more read parameters to selected memory cells in a selected tier of the selected block to read the selected memory cells.

16. The non-volatile storage system of claim 15, wherein:

the one or more read parameters include at least one hard bit reference voltage having a magnitude that depends on the programmed/erase status of the non-selected tiers in the selected block; and the read means applies the at least one hard bit reference voltage to control gates of memory cells in the selected to the read the selected memory cells.

17. The non-volatile storage system of claim 15, wherein the read means is further for:

performing a single sensing operation in the non-selected tiers in the selected block to determine whether the non-selected tiers in the selected block are fully erased or fully programmed.

18. The non-volatile storage system of claim 15, wherein:

the one or more read parameters comprise a set of base reference voltages that each distinguish between two data states and offsets to each base reference voltage, each base reference voltage having a magnitude that depends on the programmed/erase status of the non-selected tiers in the selected block; and the read means applies the set of base reference voltages with the different offsets to control gates of memory cells in the selected to the read the selected memory cells.

19. The non-volatile storage system of claim 18, further comprising:

reference voltage update means for updating the base reference voltage based on results of decoding data read using the set of reference voltages.

* * * * *